(12) United States Patent
Gopalakrishnan et al.

(10) Patent No.: US 6,874,133 B2
(45) Date of Patent: Mar. 29, 2005

(54) INTEGRATED CIRCUIT DESIGN LAYOUT COMPACTION METHOD

(75) Inventors: Prakash Gopalakrishnan, Pittsburgh, PA (US); Rob A. Rutenbar, Pittsburgh, PA (US); Elias Fallon, Tempe, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 210 days.

(21) Appl. No.: 10/309,958

(22) Filed: Dec. 4, 2002

(65) Prior Publication Data

US 2004/0111682 A1 Jun. 10, 2004

(51) Int. Cl.$^7$ .............................................. G06F 17/50
(52) U.S. Cl. ................................................................ 716/2
(58) Field of Search ................................................ 716/2

(56) References Cited

U.S. PATENT DOCUMENTS

| | | | | |
|---|---|---|---|---|
| 5,625,568 A | * | 4/1997 | Edwards et al. | 716/2 |
| 5,636,132 A | * | 6/1997 | Kamdar | 716/2 |
| 6,035,108 A | * | 3/2000 | Kikuchi | 716/2 |
| 6,378,123 B1 | * | 4/2002 | Dupenloup | 716/18 |
| 6,446,239 B1 | * | 9/2002 | Markosian et al. | 716/2 |
| 6,550,046 B1 | * | 4/2003 | Balasa et al. | 716/8 |
| 6,587,992 B2 | * | 7/2003 | Marple | 716/2 |
| 6,782,516 B2 | * | 8/2004 | Rittman et al. | 716/4 |

* cited by examiner

Primary Examiner—Stacy A. Whitmore
(74) Attorney, Agent, or Firm—Morrison & Foerster LLP

(57) ABSTRACT

A plurality of member devices is defined in a conformal outline having a pair of spaced parallel sides. Associated with each member device is a spacing constraint that sets a minimum distance the member device can be spaced from another member device and each side of the conformal outline. The spacing between member devices and/or the sides of the conformal outline are increased and/or decreased as necessary to minimize the area of the conformal outline that the member devices are received in with no violation of the spacing constraints while excluding from the conformal outline all or part of any nonmember devices defined therein.

13 Claims, 11 Drawing Sheets

INTEGRATED CIRCUIT DESIGN LAYOUT COMPACTION METHOD

BACKGROUND OF THE INVENTION

1. Field of the Invention

The present invention relates to the automatic layout of one or more devices forming a circuit, especially an analog circuit, and, more particularly, to the automatic compaction of devices forming the circuit and the relocation of each device not forming part of the circuit to a position outside a boundary of the circuit.

2. Description of Related Art

Heretofore, the layout of devices forming an analog circuit, such as an operational amplifier or a comparator, included the manual or automated placement of a plurality of devices, e.g., transistors, in one conformal outline or in a group of adjacent conformal outlines. In some instances, this layout included the placement of all or part of one or more devices not associated with the circuit in one or more of the conformal outlines.

Once the initial layout of devices associated with the circuit (herein "member devices") and devices not associated with the circuit (herein "nonmember devices") was complete, it was often necessary for designers to manually manipulate the positions of one or more member devices and/or one or more nonmember devices in order to "compact" the circuit into a minimal space while adhering to design rules, such as a spacing constraint, for each member device and each nonmember device.

As used herein, the terms "compact", "compaction" and the like, are utilized to refer to a process whereby one or more distances between member devices of a circuit and/or between the sides and/or the edges of one or more conformal outlines in which the member devices are received are adjusted, e.g., increased and/or decreased, as necessary, whereupon the resultant conformal outline(s) include(s) the member devices with no violations of any spacing constraints thereof in at least one of the horizontal and vertical directions. In addition, these terms also refer to the repositioning of all or part of one or more nonmember devices from inside the one or more conformal outlines to a position outside the one or more conformal outlines. The meaning of these terms, as used herein, is believed to be consistent with their usage by those of ordinary skill in the art to which the present invention pertains.

One problem with manual compaction is that optimal or near optimal compaction cannot be assured. Moreover, it is expensive and time consuming for a designer to perform manual compaction. Still further, there is no guarantee during manual compaction that the relative location of devices inside a conformal outline will be preserved. Lastly, there is no guarantee during manual compaction that the general shape of the conformal outline or a group of adjacent conformal outlines will be preserved.

It is, therefore, desirable to overcome the above problems and others by providing an automated circuit design layout compaction method that preserves relative locations of member devices inside a conformal outline; removes nonmember devices from inside these conformal outlines; ensures that the final circuit layout meets all of its design rules; compacts the conformal outlines and the member devices positioned therein while maintaining appropriate spacing between each member device; and preserves the general shape of the conformal outline during compaction.

Still other desirable features will become apparent to those of ordinary skill in the art upon reading and understanding the following detailed description.

SUMMARY OF THE INVENTION

The invention is a circuit design layout compaction method that includes defining a conformal outline having a pair of spaced parallel sides and defining in the conformal outline a first member device and a second member device. A spacing constraint is associated with each member device. The spacing constraint sets a minimum distance the member device can be spaced from other member devices and each side of the conformal outline. A spacing between the first and second member devices is decreased until no further decrease in spacing therebetween can occur without violating a spacing constraint. The spacing between the sides of the conformal outline is decreased until no further decrease in spacing between the sides can occur without at least one of the sides violating a spacing constraint.

The method can also include defining at least a portion of at least one nonmember device in the conformal outline and defining a pair of spaced parallel sweep lines between the sides of the conformal outline. A spacing constraint can be associated with each nonmember device or each sweep line. The spacing constraint associated with each nonmember device sets a minimum distance the nonmember device can be spaced from each sweep line and another nonmember device. The spacing constraint associated with each sweep line sets a minimum distance the sweep line can be spaced from each nonmember device. The spacing between the sweep lines is increased whereupon each sweep line overlays one of the sides of the conformal outline. Responsive to increasing the spacing between the sweep lines, each nonmember device is positioned outside the conformal outline whereupon the spacing constraint of each nonmember device or each sweep line is not violated.

If one of the sweep lines overlaps the one nonmember device when the sweep lines are defined in the conformal outline, the one nonmember device can be positioned outside the conformal outline on the side thereof that is overlapped by said one sweep line. If the pair of sweep lines overlap the one nonmember device when the pair of sweep lines is defined in the conformal outline, the sweep line having the most area of the one nonmember device between it and the side of the conformal outline that said sweep line overlaps after movement is determined and the one nonmember device is positioned outside the conformal outline adjacent said side.

The invention is also a circuit design layout compaction method that includes defining a plurality of adjacent conformal outlines and a plurality of member devices positioned in at least one of the conformal outlines, with each conformal outline having a pair of spaced parallel sides and with each pair of adjacent conformal outlines having sides that at least partially overlap. A spacing constraint is associated with each member device. The spacing constraint sets a minimum distance the member device can be spaced from another member device and a portion of any side that does not overlap another side. A spacing between at least one pair of member devices is decreased until no further decrease in spacing therebetween can occur without violating a spacing constraint. Subject to the sides of each pair of adjacent conformal outlines remaining overlapping, the spacing between the sides of each conformal outline is decreased until no further decrease in spacing between the sides of each conformal outline can occur without at least one of the sides violating a spacing constraint.

The method can also include defining a pair of spaced parallel sweep lines between the sides of each conformal outline and defining at least one nonmember device that is at least partially received in at least one conformal outline. A spacing constraint can be associated with each nonmember device or each sweep line. The spacing constraint associated with each nonmember device sets a minimum distance the nonmember device can be spaced from each sweep line and another nonmember device. The spacing constraint associated with each sweep line sets a minimum distance the sweep line can be spaced from each nonmember device. The spacing between each pair of sweep lines can be increased whereupon each sweep line overlaps one of the sides of the conformal outline where it was defined.

If the initial position of the one nonmember device is between the starting position of one of the sweep lines and the final position of said one sweep line, the method includes positioning the one nonmember device outside the conformal outline where the one sweep line was defined and adjacent the final position of the one sweep line with no violation of the spacing constraint of the one nonmember device or the sweep line.

If the initial position of the one nonmember device is between two sweep lines in adjacent conformal outlines, the method includes selecting one of the two sweep lines and positioning the one nonmember device outside the conformal outline where the selected sweep line was defined and adjacent the final position of the selected sweep line with no violation of the spacing constraint of the one nonmember device or the selected sweep line. The selection of one of the two sweep lines can include comparing an amount of overlap of a projection of the nonmember device on each of the two sweep lines and selecting as the one sweep line the one having the largest overlap.

The invention is also a circuit design layout compaction method that includes defining a conformal outline having a pair of spaced parallel sides and defining in the conformal outline a first member device and a second member device. Each member device has associated therewith a spacing constraint that sets a minimum distance the member device can be spaced from the other member device and from each side of the conformal outline. The first and second member devices are defined in the conformal outline with a violation of one of the spacing constraints thereof. The spacing between the first and second member devices is increased whereupon the violation of the one spacing constraint is overcome.

The method can also include increasing the spacing between the sides of the conformal outline to avoid a violation of at least one spacing constraint by one of the sides when the spacing between the first and second member devices is increased.

The method can also include defining at least one nonmember device that is at least partially received in the conformal outline and defining a pair of spaced parallel sweep lines between the sides of the conformal outline. A spacing constraint can be associated with each nonmember device or each sweep line. The spacing constraint associated with each nonmember device sets a minimum distance the nonmember device can be spaced from each sweep line and another nonmember device. The spacing constraint associated with each sweep line sets a minimum distance a sweep line can be spaced from each nonmember device. The spacing between the sweep lines can be increased whereupon each sweep line overlaps one of the sides of the conformal outline. Responsive to the increased spacing between the sweep lines, the one nonmember device can be positioned outside the conformal outline whereupon the spacing constraint of each nonmember device or each sweep line is not violated.

The invention is also a circuit design layout compaction method that includes defining a plurality of adjacent conformal outlines, with each conformal outline having a pair of spaced parallel sides and with each pair of adjacent conformal outlines having sides that at least partially overlap. A plurality of member devices can be defined in at least one of the conformal outlines, with each member device having a spacing constraint associated therewith that sets a minimum distance the member device can be spaced from another member device and a portion of any side that does not overlap another side. At least two member devices are defined in the conformal outlines with a violation of one of the spacing constraints thereof. A spacing between the two member devices can be increased whereupon the violation of the one spacing constraint is overcome.

The method can also include, subject to the sides of each pair of adjacent conformal outlines remaining overlapping, increasing the spacing between the sides of each conformal outline to avoid a violation of at least one spacing constraint by one of the sides.

The method can also include defining a pair of spaced parallel sweep lines between the sides of each conformal outline and defining at least one nonmember device that is at least partially received in at least one conformal outline. A spacing constraint can be associated with each nonmember device or each sweep line. The spacing between each pair of sweep lines can be increased whereupon each sweep line overlaps one of the sides of the conformal outline where the sweep line was defined.

The method is also a circuit design layout compaction method that includes defining a first layout of a plurality of member devices having therearound a conformal outline having a pair of spaced parallel sides. A spacing constraint is associated with each member device that sets a minimum distance the member device can be spaced from another member and/or from each side of the conformal outline. Where the first layout has a violation of at least one spacing constraint, a second layout of the member device is defined therefrom wherein the second layout has an increased spacing between each pair of member devices having a violation of at least one of the spacing constraints thereof in the first layout whereupon, in the second layout, the at least one spacing constraint violation is overcome. Where one of the first and second layouts has no violation of at least one spacing constraint, a third layout of the member devices can be defined therefrom wherein a spacing between at least one pair of member devices is decreased whereupon no further decreases in spacing between each pair of member devices can occur without violating at least one spacing constraint.

A pair of spaced parallel sweep lines can be defined between the sides of the conformal outline and at least a portion of at least one nonmember device can be defined in the conformal outline. A spacing constraint can be associated with each nonmember device or each sweep line. The spacing between the sweep lines can be increased whereupon each sweep line overlaps one of the sides. Responsive to increasing the spacing between the sweep lines, each nonmember device is positioned outside the conformal outline whereupon the spacing constraint of each nonmember device or each sweep line is not violated.

Lastly, the invention is a circuit design layout compaction method that includes defining a plurality of adjacent con formal outlines and a first layout of a plurality of member devices in at least one of the conformal outlines, with each conformal outline having a pair of spaced parallel sides and with each pair of adjacent conformal outlines having sides that at least partially overlap. A spacing constraint is associated with each member device that sets a minimum distance the member device can be spaced from another member device or from each non-overlapping portion of each side of each conformal outline. Where the first layout has a violation of at least one spacing constraint, a second layout of the member devices can be defined therefrom wherein spacing between each pair of member devices having a violation of at least one of the spacing constraints thereof in the first layout is increased whereupon, in the second layout, the at least one spacing constraint violation is overcome. Where one of the first and second layouts has no violation of at least one spacing constraint, a third layout of the member devices can be defined therefrom wherein spacing between at least one pair of member devices is decreased whereupon no further decreases in spacing between each pair of member devices can occur without violating at least one spacing constraint.

A pair of spaced parallel sweep lines can be defined between the sides of each conformal outline and at least a portion of at least one nonmember device can be defined in at least one conformal outline. A spacing constraint can be associated with each nonmember device or each sweep line. The spacing between each pair of sweep lines can be increased whereupon each sweep line overlaps one of the sides it was defined between. Responsive to increasing the spacing between the sweep lines, each nonmember device is positioned outside the conformal outline whereupon the spacing constraint of each nonmember device or each sweep line is not violated.

DETAILED DESCRIPTION OF THE INVENTION

The present invention will be described with reference to the accompanying figures where like reference numbers correspond to like elements. In the following description, the terms left, right, up, down, horizontally, and vertically and the like are with reference to the orientation of the figures and are not to be construed as limiting the invention.

Figure 1A:
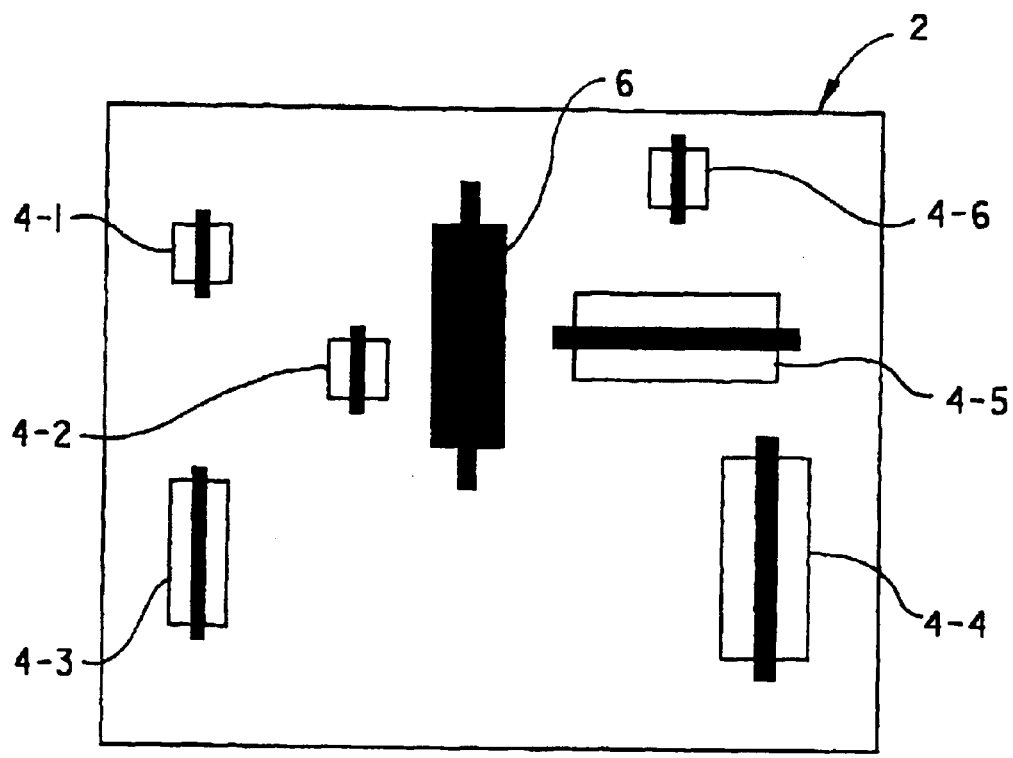
FIG. 1(a) shows a conformal outline of a circuit having member devices and a nonmember device defined therein.

With reference to FIG. 1(a), a conformal outline 2 defines the boundaries of a circuit to be implemented on an integrated circuit (IC) or a printed circuit board (PCB). The circuit includes one or more member devices 4 defined in conformal outline 2. In the embodiment shown in FIG. 1(a), member devices 4-1 to 4-6 are defined in conformal outline 2. One or more nonmember devices 6 can also be defined in conformal outline 2. However, the number and locations where member devices 4-1 to 4-6 and nonmember device 6 are defined in conformal outline 2 is not to be construed as limiting the invention. As used herein, the phrase "member device" means a device that is desired to be included within conformal outline 2 and the phrase "nonmember device" means a device that is desired to be excluded from conformal outline 2.

Figure 1B:
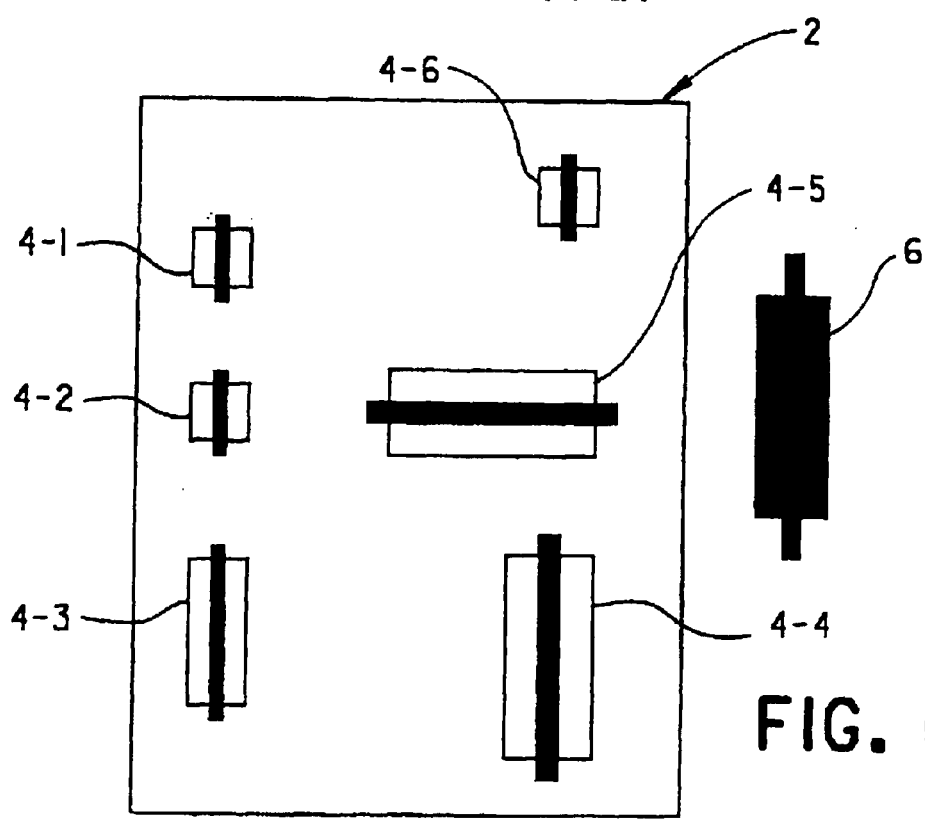
FIG. 1(b) shows the conformal outline and the member devices of FIG. 1(a) after compaction, with the nonmember device defined outside the conformal outline.

It is generally desirable in the layout of IC's or PCB's to minimize the area of conformal outline 2 that includes member devices 4 having appropriate spacing therebetween while, at the same time, excluding nonmember device 6 from conformal outline 2. The present invention is an automated method of compaction that is utilized to minimize the area of conformal outline 2 receiving member devices 4-1 to 4-6 with appropriate spacing therebetween while excluding nonmember device 6 from conformal outline 2. Generally speaking, the compaction method can increase and/or decrease the spacing or distance between member devices and/or increase and/or decrease the spacing or distance between sides (and/or edges) of one or more conformal outlines as necessary to minimize the area of the one or more conformal outlines in which the member devices are received with no violation of a spacing constraint (discussed hereinafter) and to reposition all or part of any nonmember device initially received in the one or more conformal outlines to a position outside the one or more conformal outlines. The result of compacting the circuit of FIG. 1(a) by decreasing the distance between member devices 4 and the sides of conformal outline 2 and excluding nonmember device 6 from conformal outline 2 is shown in FIG. 1(b). The compaction of conformal outline 2 will now be described in greater detail.

The compaction method is embodied in a computer software program which can be configured to run on a general purpose computer or work station of the type known in the art. Initially, the compaction method will be described in connection with compacting conformal outline 2 and member devices 4-1 to 4-6. Thereafter, the method will be described in connection with moving nonmember device 6 outside of compacted conformal outline 2. However, this order is not to be construed as limiting the invention.

Figure 2A:
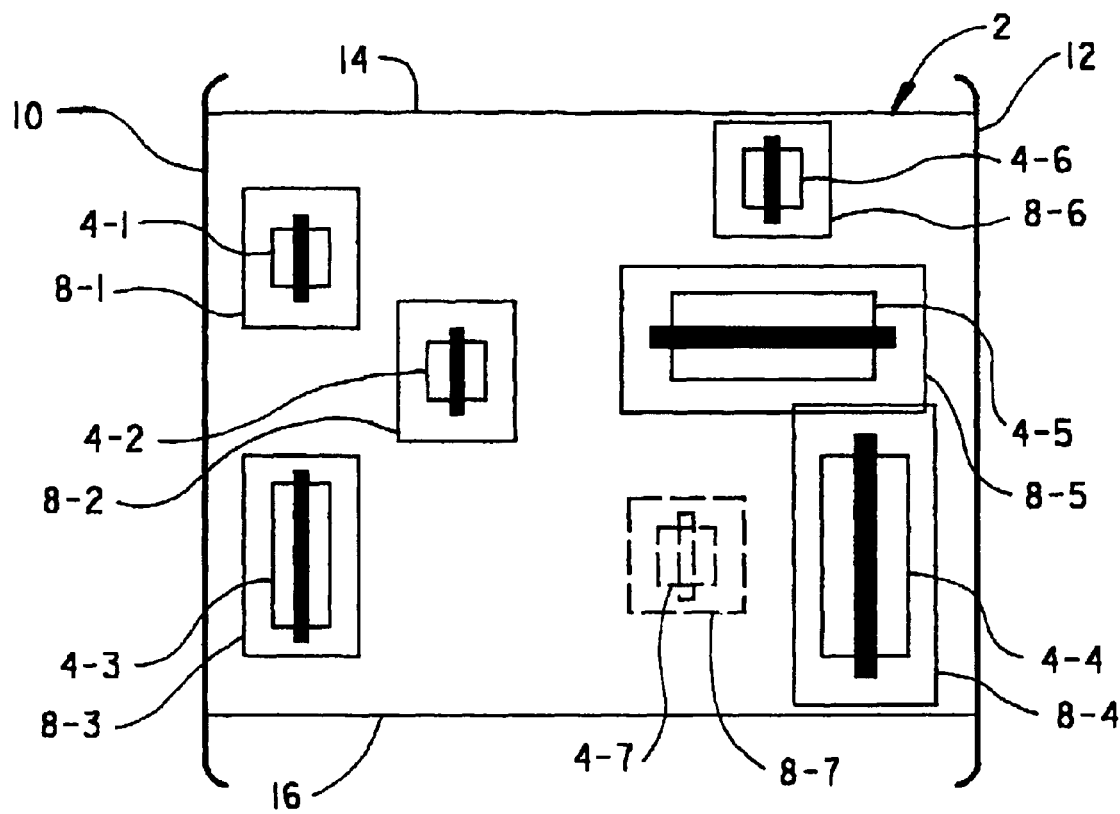
FIG. 2(a) shows the conformal outline and the member devices of FIG. 1(a) before compaction.
Figure 2B:
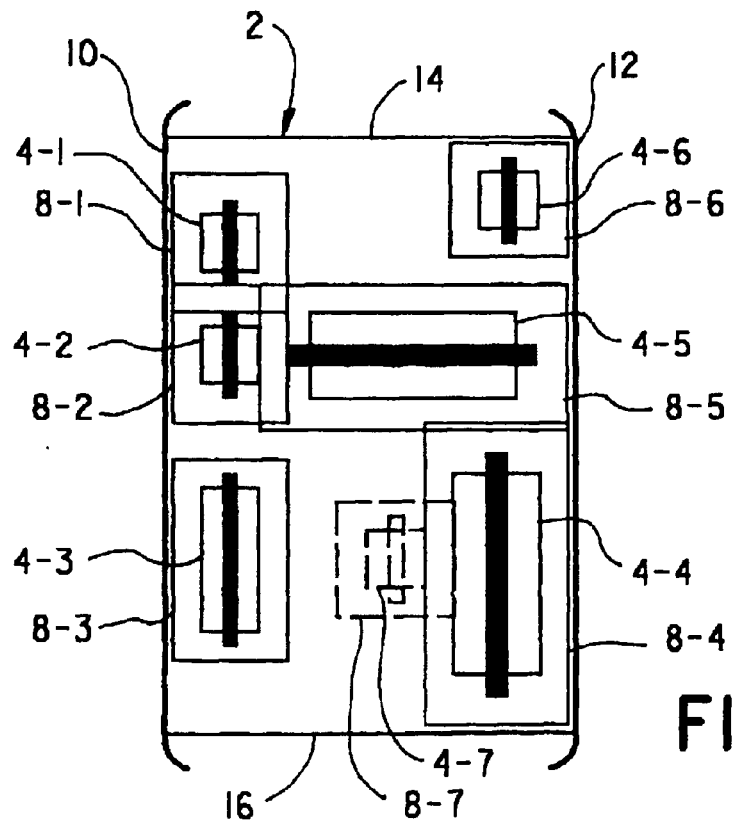
FIG. 2(b) shows the conformal outline and the member devices of FIG. 2(a) after compaction.

With reference to FIGS. 2(a) and 2(b), where nonmember device 6 has been omitted for the purpose of illustration, conformal outline 2 is defined by a pair of spaced parallel sides 10 and 12 and a pair of spaced parallel edges 14 and 16 that establish a boundary of the circuit. Spacing constraints 8-1 to 8-6 are associated with member devices 4-1 to 4-6, respectively. Each spacing constraint 8 sets a minimum distance the corresponding member device 4 can be spaced from (i) another member device 4, (ii) each side 10 and 12 of conformal outline 2 and, if desired, (iii) each edge 14 and 16 of conformal outline 2.

At an appropriate time, the horizontal distance between member devices 4 and/or sides 10 and 12 of conformal outline 2 are caused to decrease. Decreasing the distance between member devices 4 and/or sides 10 and 12 can occur in any order or simultaneously. Moreover, the compaction of member devices 4 and/or sides 10 and 12 can be accomplished iteratively or by solving a system of simultaneous equations that express the spacing relationships between member devices 4; nonmember device 6; sides 10 and 12; and/or edges 14 and 16. For the purpose of illustration, the compaction of member devices 4 and sides 10 and 12 will be described as occurring iteratively, with member devices 4 moving in response to decreasing the distance between sides 10 and 12. However, this is not to be construed as limiting the invention.

As can be seen in FIG. 2(a), decreasing the distance between sides 10 and 12 would result in a violation of one or more spacing constraints 8. In response to a possible violation of a spacing constraint 8 caused by decreasing the distance between sides 10 and 12, each member device 4 whose spacing constraint 8 would be violated by such decrease moves in the same direction as the side that would cause the violation providing such movement, by itself, would not result in a violation of any spacing constraint 8.

For example, suppose that decreasing the distance between sides 10 and 12 would cause side 12 to overlap the right edge of spacing constraint 8-4. To avoid violating spacing constraint 8-4, member device 4-4 moves toward side 10. Similar comments apply in respect of the movement of any member device 4 in response to decreasing the distance between sides 10 and 12, where such movement, by itself, would violate the spacing constraint 8 thereof.

The movement of member devices 4 in response to decreasing the distance between sides 10 and 12 in the manner described above continues until any further decrease in the distance between sides 10 and 12 would result in a violation of one or more spacing constraints 8 that cannot be avoided by moving at least one member device 4. For example, in FIG. 2(b), any further movement of member device 4-2 toward side 12 would cause a violation spacing constraint 8-2 by member device 4-5. Similarly, any further movement of member device 4-5 toward side 10 would cause a violation spacing constraint 8-5 by member device 4-2. Accordingly, no further decrease in the distance between sides 10 and 12 can occur without violating spacing constraints 8-2 and spacing constraint 8-5. Accordingly, the compaction of conformal outline 2 by decreasing the distance between member devices 4-1 to 4-6 and sides 10 and 12 is terminated.

In the foregoing description, no member devices 4 were in the movement path of another member device 4. However, the spacing constraint 8 of each member device 4 accounts for this situation by setting the minimum distance each member device 4 can be spaced from another member device 4. Thus, if the movement of one member device 4 in response to decreasing the distance between sides 10 and 12 would result in a violation of the spacing constraint thereof or the spacing constraint of another member device 4, both member devices 4 move in the direction of the side that would cause the violation if such movement, by itself, would not result in the violation of the spacing constraint 8 that cannot be avoided by movement of any member device 4.

For example, as shown in FIG. 2(a), suppose a member device 4-7, shown in phantom, is included in uncompacted conformal outline 2 to the side of member device 4-4 opposite side 12. Thereafter, decreasing the distance between sides 10 and 12 causes member device 4-4 to move toward side 10 in the manner described above. Eventually, this movement will cause member device 4-4 to move sufficiently toward member device 4-7 so that any further movement of member device 4-4 would result in a violation of spacing constraint 8-4 or a spacing constraint 8-7 associated with member device 4-7. Under this circumstance, member devices 4-4 and 4-7 move in the same direction as side 12 if such movement, by itself, would not result in a violation of any spacing constraint 8 that cannot be avoided by moving at least one member device 4. As shown in FIG. 2(b), member devices 4-4 and 4-7 move together in response to decreasing the distance between sides 10 and 12 until no further compaction of member devices 4 can be realized without the violation of a spacing constraint 8 that cannot be avoided by the movement of at least one member device 4.

If desired, the foregoing compaction method can be applied, as necessary, to decreasing the vertical distance between member devices 4-1 to 4-6 and/or edges 14 and 16. Since it will be apparent to one of ordinary skill in the art that the foregoing method of decreasing the horizontal distance between devices 4-1 to 4-6 and sides 10 and 12 is equally applicable to decreasing the vertical distance between member devices 4-1 to 4-6 and edges 14 and 16, a detailed description of the foregoing method in connection with decreasing the vertical distance between member devices 4-1 to 4-6 and edges 14 and 16 has not been included herein to avoid needless repetition.

The movement of nonmember device 6 outside of conformal outline 2 will now be described with reference to FIGS. 3(a) and 3(b) where member devices 4-1 to 4-6 have been omitted for the purpose of illustration.

In the compaction method, a pair of spaced parallel sweep lines 18 and 20 is defined between sides 10 and 12 of conformal outline 2 and a spacing constraint 22 is associated with each nonmember device 6. Each spacing constraint 22 sets a minimum distance the corresponding nonmember device 6 can be spaced from each sweep line 18 and 20 and another nonmember device 6.

It should be noted that spacing constraint 8 of each member device 4 is only affected by sides 10 and 12; edges 14 and 16; and other member devices 4. Similarly, spacing constraint 22 of each nonmember device 6 is only affected by sweep lines 18 and 20. Thus, one or both sweep lines 18 and 20 overlaying a spacing constraint 8 has no effect on the movement of the corresponding member device 4. Similarly, one or both sides 10 and 12 overlaying spacing constraint 22 has no effect on the movement of nonmember device 6. The compaction method of the present invention utilizes these features advantageously to selectively compact member devices 4 and conformal outline 2 and to move each nonmember device 6 outside of compacted conformal outline 2.

Once the pair of sweep lines 18 and 20 is defined between sides 10 and 12, and spacing constraint 22 has been associated with nonmember device 6, the distance between sweep lines 18 and 20 is caused to increase. If increasing the distance between sweep lines 18 and 20 would result in a violation of spacing constraint 22, nonmember device 6 moves in the same direction as the sweep line that would cause the violation providing such movement, by itself, would not result in the violation of a spacing constraint.

Figure 3A:
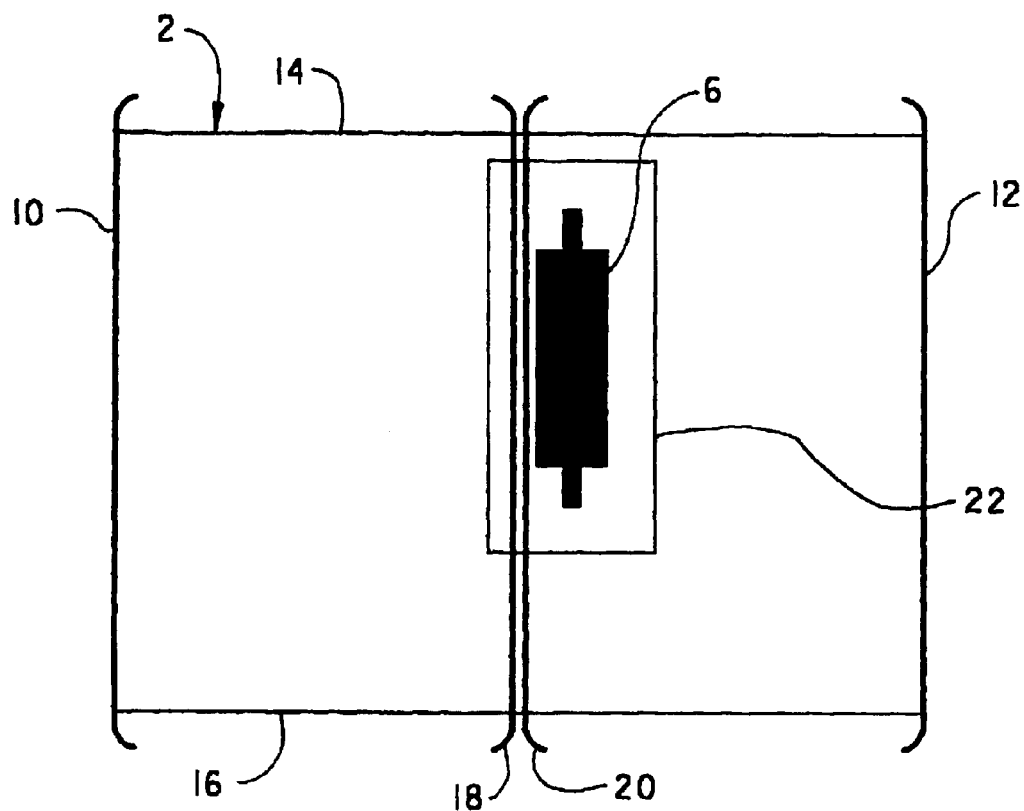
FIG. 3(a) shows the conformal outline and the nonmember device of FIG. 1(a) before compaction, including sweep lines defined between the sides of the conformal outline.

For example, in FIG. 3(a), sweep lines 18 and 20 overlap spacing constraint 22 of nonmember device 6. However, because nonmember device 6 is positioned entirely to the movement side of sweep line 20, nonmember device 6 moves in the same direction as sweep line 20.

Because the initial position of sweep line 20 violates spacing constraint 22, nonmember device 6 initially moves toward side 12 a distance sufficient to avoid the starting position of sweep line 20 from violating spacing constraint 22. Thereafter, nonmember device 6 moves in the same direction as sweep line 20. Since spacing constraint 22 is unaffected by side 12, the movement of sweep line 20 toward side 12 continues until nonmember device 6 moves outside of conformal outline 2.

Suppose, in FIG. 3(a), that sweep lines 18 and 20 both overlay nonmember device 6. In this case, the decision to move nonmember device 6 in the same direction as sweep line 20 or sweep line 18 can be based on which sweep line 18 or 20 has the largest area of nonmember device 6 to the movement side thereof. For example, if the area of nonmember device 6 on the movement side of sweep line 20 is greater than the area of nonmember device 6 on the movement side of sweep line 18, nonmember device 6 moves in the same direction as sweep line 20. Where an equal area of nonmember device 6 resides on the movement sides of sweep lines 18 and 20, the decision to move nonmember device 6 in the direction of sweep line 18 or sweep line 20 can be made arbitrarily.

If moving one nonmember device, e.g., 6, in response to movement of sweep line 18 or 20 would result in the violation of the spacing constraint of the nonmember device or another nonmember device (not shown) in the movement path of the one nonmember device, both nonmember devices move in the same direction as the sweep line.

Figure 3B:
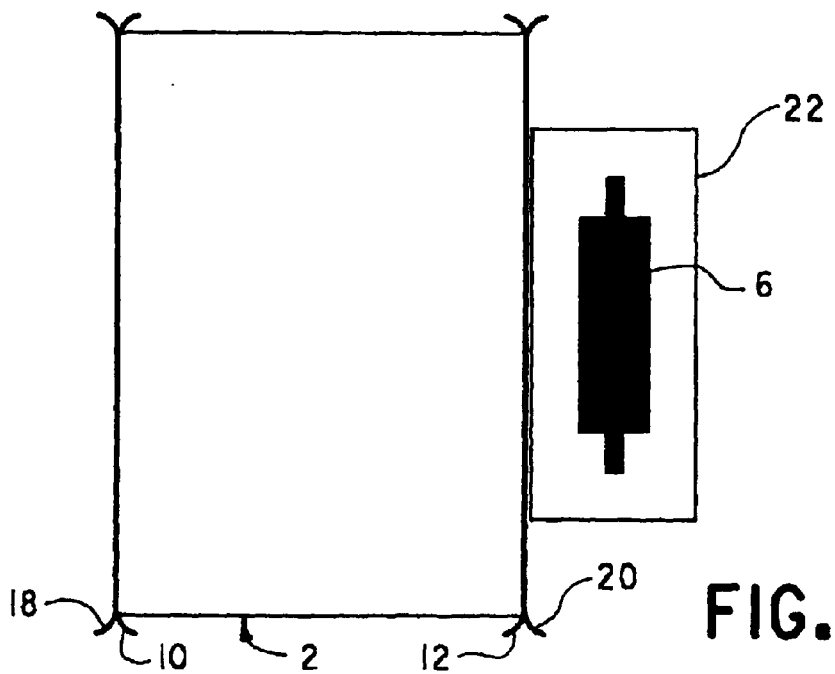
FIG. 3(b) shows the conformal outline and the nonmember device of FIG. 3(a) after compaction, with the nonmember device defined outside the compacted conformal outline.

If the distance between sides 10 and 12 decreases at the same time the distance between sweep lines 18 and 20 increases, nonmember device 6 will move outside of compacted conformal outline 2 as shown in FIG. 3(b). Decreasing the distance between sweep lines 18 and 20 is terminated when they overlap or are coincident with sides 10 and 12, respectively.

As can be seen, when the results of compacting member devices 4 and conformal outline 2 shown in FIG. 2(b) and the results of moving nonmember device 6 outside of compacted conformal outline 2 shown in FIG. 3(b) are combined, they yield the compaction shown in FIG. 1(b). The compaction shown in FIG. 1(b) is advantageous because it not only has member devices 4-1 to 4-6 and conformal outline 2 well compacted but also includes nonmember device 6 in close relation to compacted conformal outline 2.

In the foregoing description, spacing constraint 22 is associated with each nonmember device 6. However, if desired, a spacing constraint can be associated with each sweep line 18 and 20 instead of nonmember device 6. This spacing constraint sets a minimum distance the corresponding sweep line 18 or 20 can be spaced from a nonmember device 6. The movement of nonmember device 6 in FIGS. 3(a) and 3(b) would occur in the same manner as described above in response to the spacing constraint associated with each sweep line. However, if a circuit included two or more nonmember devices 6, the absence of a spacing constraint associated with each nonmember device may result in an overlap of the two or more nonmember devices 6 when moved outside of conformal outline 2. This can easily be remedied by manual manipulation of the overlapping nonmember devices 6 by a user of the computer software program of the present invention via a suitable user interface.

The compaction method of the present invention will now be described in connection with a plurality of adjacent conformal outlines having a plurality of member devices positioned in at least one of the conformal outlines.

Figure 4A:
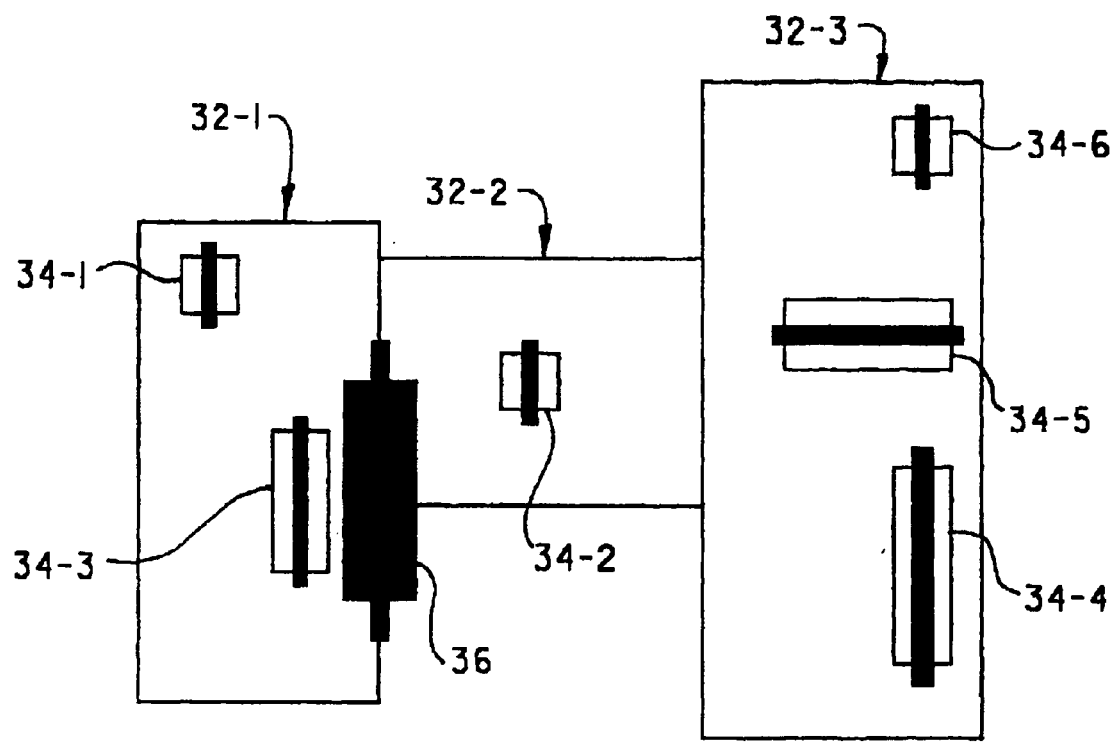
FIG. 4(a) shows a plurality of adjacent conformal outlines of a circuit with member devices defined therein and with a nonmember device partially received in two of the conformal outlines.

With reference to FIG. 4(a), a plurality of member devices 34-1 to 34-6 is defined in at least one of a plurality of adjacent conformal outlines 32-1 to 32-3. In the illustrated embodiment, member devices 34-1 and 34-3 are initially defined in conformal outline 32-1; member device 34-2 is defined in conformal outline 32-2; and member devices 34-4 to 34-6 are defined in conformal outline 32-3. The circuit also includes nonmember device 36 partially defined in conformal outlines 32-1 and 32-2. However, the number and locations where member devices 34-1 to 34-6 and nonmember device 36 are defined in conformal outlines 32-1 to 32-2 is not to be construed as limiting the invention.

Figure 4B:
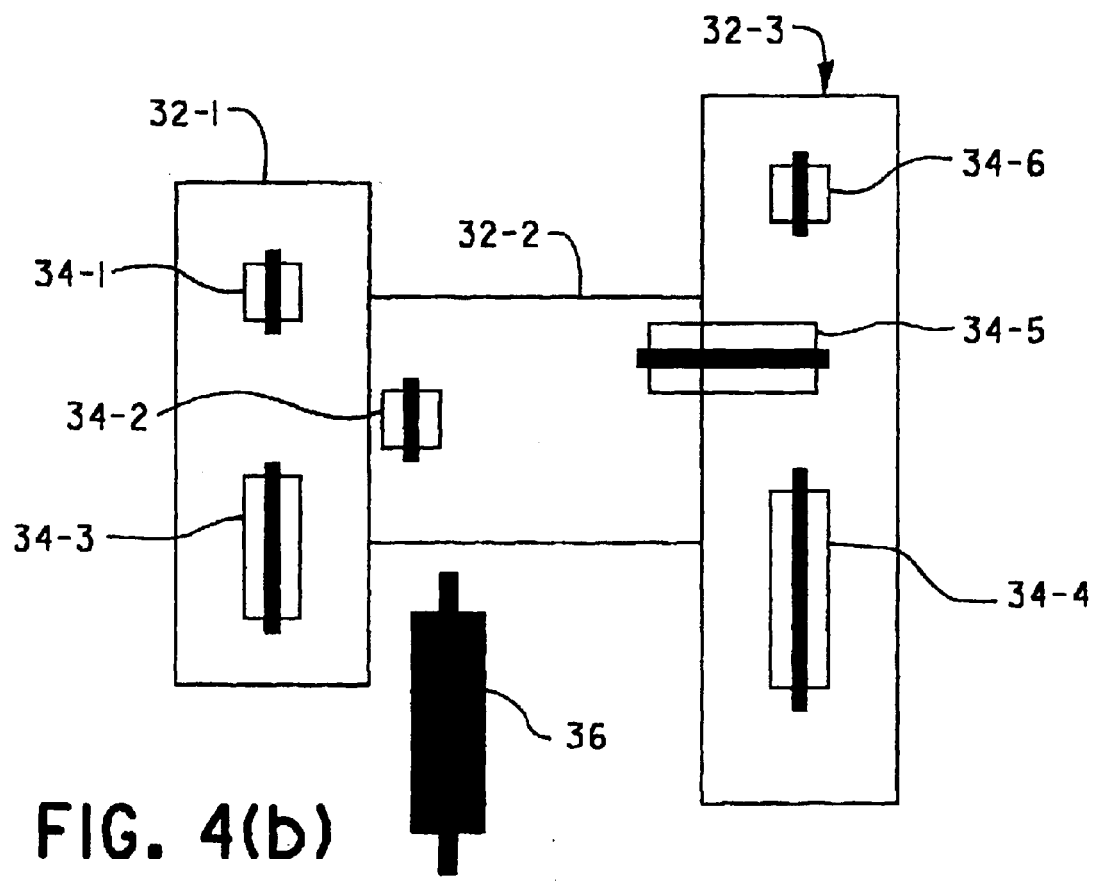
FIG. 4(b) shows the conformal outlines and member devices of FIG. 4(a) after compaction, with the nonmember device defined outside the conformal outlines.

It is desirable to utilize the compaction method to compact the circuit shown in FIG. 4(a) to minimize the area of conformal outlines 32-1 to 32-3 while maintaining appropriate spacing between member devices 34-1 to 34-6 and excluding nonmember device 36 from conformal outlines 32-1 to 32-3. The result of compacting the circuit of FIG. 4(a) is shown in FIG. 4(b).

Figure 5A:
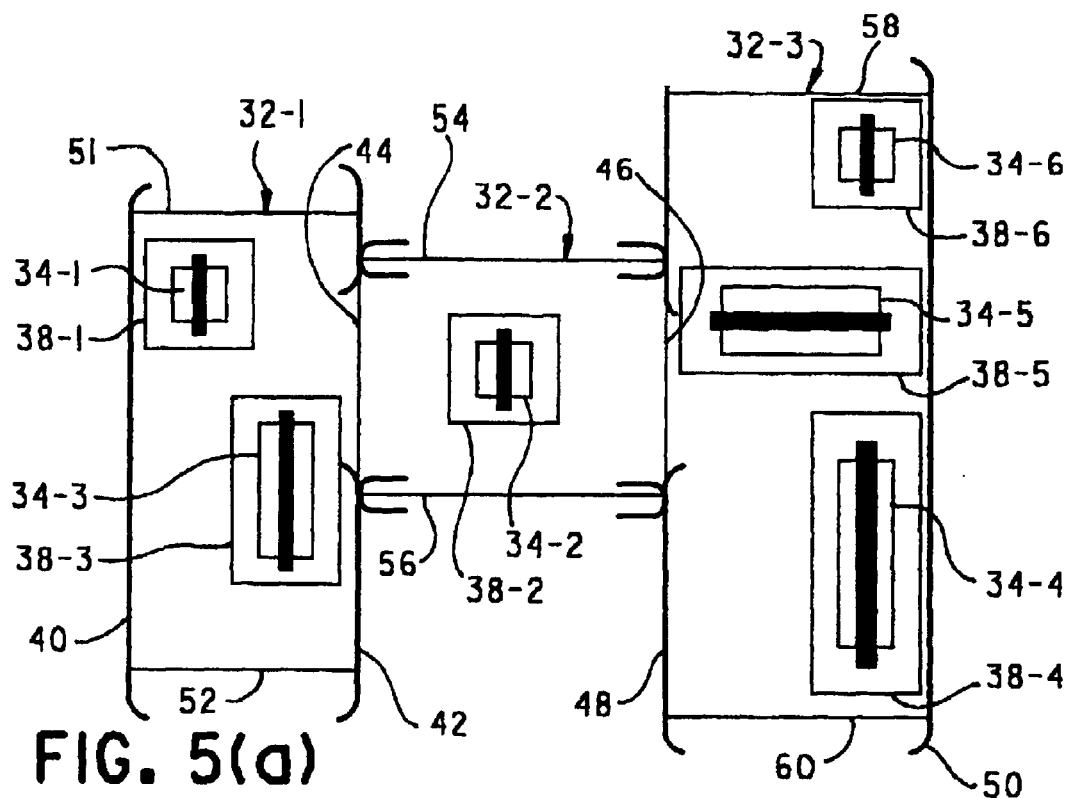
FIG. 5(a) shows the conformal outlines and member devices of FIG. 4(a) before compaction.

The compaction of conformal outlines 32-1 to 32-3 and member devices 34-1 to 34-6 will be described with reference to FIGS. 5(a) and 5(b) where nonmember device 36 has been omitted for the purpose of illustration. As shown in FIG. 5(a), each conformal outline 32-1 to 32-3 is defined by a pair of spaced parallel sides. Specifically, conformal outline 32-1 is defined by sides 40 and 42; conformal outline 32-2 is defined by sides 44 and 46; and conformal outline 32-3 is defined by sides 48 and 50. In addition, each conformal outline 32-1 to 32-3 is defined by a pair of spaced parallel edges. Specifically, conformal outline 32-1 is defined by edges 51 and 52; conformal outline 32-2 is defined by edges 54 and 56; and conformal outline 32-3 is defined by edges 58 and 60. The sides of each pair of adjacent conformal outlines 32-1 to 32-3 overlap. Namely, sides 42 and 44 overlap, and sides 46 and 48 overlap.

Spacing constraints 38-1 to 38-6 are associated with member devices 34-1 to 34-6, respectively. Each spacing constraint 38 sets a minimum distance the corresponding member device 34 can be spaced from (i) another member device 34, (ii) a portion of any side that does not overlap another side and, if desired, (iii) any edge 50 to 60 of conformal outlines 32-1 to 32-3. Stating condition (ii) differently, spacing constraint 38 for each member device 34 is not applicable where sides of adjacent conformal outlines 32 overlap. For example, where sides 42 and 44 overlap, spacing constraint 38 of each member device 34 is not applicable. Similarly, where sides 46 and 48 overlap, spacing constraint 38 of each member device 34 is not applicable. Hence, member devices 34 can move between conformal outlines 32-1 to 32-3 if such movement occurs where sides of conformal outlines 32-1 to 32-3 overlap. However, where the side of one conformal outline 32 does not overlap the side of another conformal outline 32, the spacing constraint 38 of each member device 34 prevents movement of the corresponding member device 34 thereacross.

At an appropriate time, subject to the sides of each pair of adjacent conformal outlines 32 remaining overlapping, the distance between member devices 34 and/or the sides of each conformal outline 32 is caused to decrease horizontally. Decreasing the horizontal distance between member devices 34 and/or sides of each conformal outline 32 can occur in any order or simultaneously. Moreover, the compaction of member devices 34 and/or sides 40 and 48 can be accomplished iteratively or by solving a system of simultaneous equations that express the spacing relationships between member devices 34; nonmember devices 36; and sides 40–50; and/or edges 51 to 60. For the purpose of illustration, the compaction of member devices 34 and sides 40–50 will be described as occurring iteratively, with the distance between member devices 34 decreasing in response to decreasing the distance between the sides of each conformal outline 32. However, this is not to be construed as limiting the invention since the distance between member devices can be decreased followed by decreasing the distance between the sides of each conformal outline 32.

If decreasing the distance between any pair of sides 40 and 42; 44 and 46; and 48 and 50 would result in a violation of the one or more spacing constraints 38, each member device 34 whose spacing constraint would be violated by such decrease moves in the same direction as the side that would cause the violation providing such movement, by itself, would not result in a violation of any spacing constraint 38.

For example, suppose the distance between sides 48 and 50 of conformal outline 32-3 decreases. As can be seen, decreasing the distance between sides 48 and 50 may result in a violation of spacing constraints 38-4 to 38-6 by side 50. To avoid these violations, member devices 34-4 to 34-6 can move toward side 48. In another example, suppose the distance between sides 40 and 42 of conformal outline 32-1 decreases. In this example, member device 34-1 can move toward side 42 and member device 34-3 can move toward side 40, as necessary, to avoid violations of spacing constraints 38-1 and 38-3.

Figure 5B:
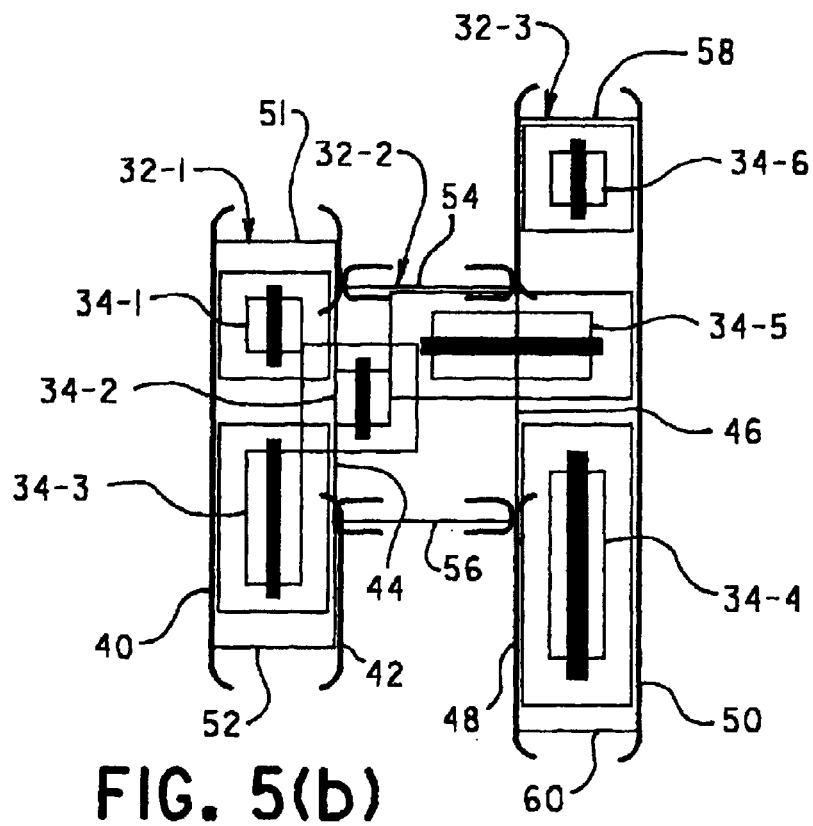
FIG. 5(b) shows the conformal outlines and member devices of FIG. 5(a) after compaction.

As shown in FIG. 5(b), the compaction of conformal outlines 32-1 to 32-3 and member devices 34-1 to 34-6 progresses until any further decrease in the distance between the sides of each conformal outline or any further decrease in the distance between member devices 34-1 to 34-6 would result in a violation of at least one spacing constraint 38 that cannot be avoided.

The movement of nonmember device 36 outside of conformal outlines 32-1 to 32-3 will now be described with reference to FIGS. 6(a) to 6(c) where member devices 34-1 to 34-6 have been omitted from conformal outlines 32-1 to 32-3 for the purpose of illustration.

Figure 6A:
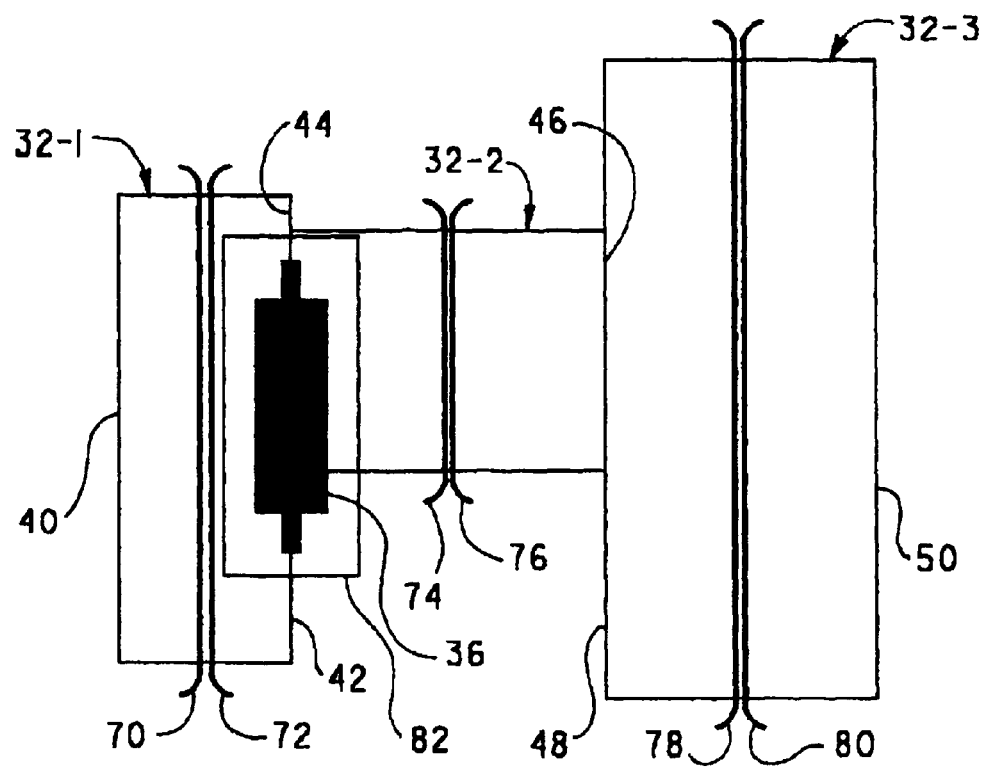
FIG. 6(a) shows the conformal outlines and the nonmember device of FIG. 4(a) before compaction, including a first pair of sweep lines defined between the sides of each conformal outline.

In FIG. 6(a) nonmember device 36 is partially defined in conformal outlines 32-1 and 32-2 and is partially defined outside of conformal outlines 32-1 to 32-2 and entirely outside conformal outline 32-3. However, this is not to be construed as limiting the invention.

A pair of spaced parallel sweep lines is defined between the sides of each conformal outline 32-1 to 32-3. Specifically, sweep lines 70 and 72 are defined between sides 40 and 42 of conformal outline 32-1; sweep lines 74 and 76 are defined between sides 44 and 46 of conformal outline 32-2; and sweep lines 78 and 80 are defined between sides 48 and 50 of conformal outline 32-3.

A spacing constraint 82 is associated with each nonmember device 36. Spacing constraint 82 sets a minimum distance each nonmember device 36 can be spaced from each sweep line and/or another nonmember device.

The distance between each pair of sweep lines is caused to increase. If increasing the distance between any pair of sweep lines would result in a violation of spacing constraint 82, nonmember device 36 moves in the same direction as the sweep line causing such violation if such movement, by itself, would not cause a violation of spacing constraint 82. Increasing the distance between each pair of sweep lines is terminated when they overlap or are coincident with the sides of the conformal outline in which they are received.

For example, in FIG. 6(a), increasing the distance between sweep lines 70 and 72 would result in a violation of spacing constraint 82 by sweep line 72. Accordingly, nonmember device 36 moves in the same direction as sweep line 72 to avoid the violation of spacing constraint 82.

In FIG. 6(a), the convergence of sweep lines 72 and 74 in adjacent conformal outlines 32-1 and 32-2 will eventually result in a violation of spacing constraint 82. In this circumstance, one of sweep lines 72 and 74 is selected whereafter the movement of nonmember device 36 is linked to the selected sweep line. Thereafter, any violation of spacing constraint 82 by the other, unselected sweep line is ignored.

The selection of one of the pair of converging sweep lines and the linking of the movement of nonmember device 36 to the selected sweep line can occur in any desirable manner. One manner of selecting one of the pair of converging sweep lines includes comparing an amount of overlap of a projection of nonmember device 36 on each pair of converging sweep lines, e.g., 72 and 74. The sweep line having the largest overlap, in this example, sweep line 72, is then selected. If the amount of overlap of a projection of nonmember device 36, on each of a pair of converging sweep lines is the same, an arbitrary selection of one of the sweep lines can be made.

Figure 6B:
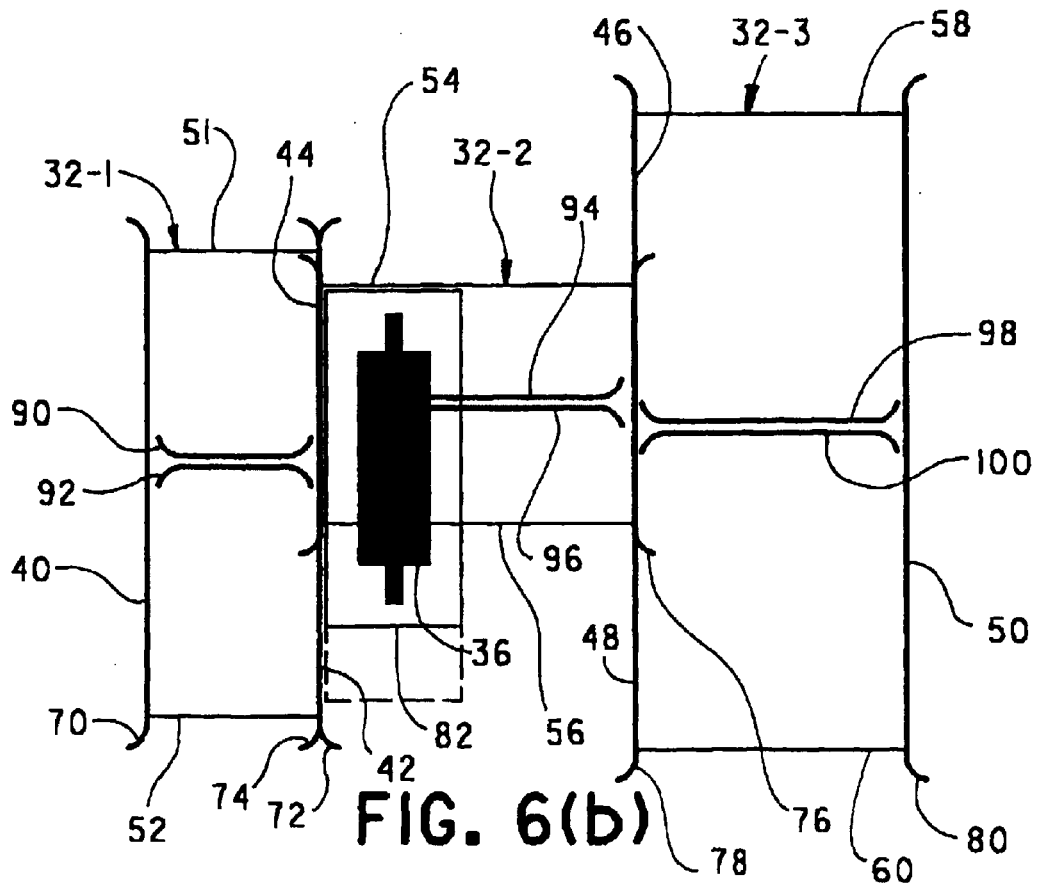
FIG. 6(b) shows the conformal outlines and nonmember device of FIG. 6(a) after compaction and after movement of the first pair of sweep lines of each conformal outline apart, with a second pair of sweep lines defined between the top and bottom edges of each conformal outline.
Figure 6C:
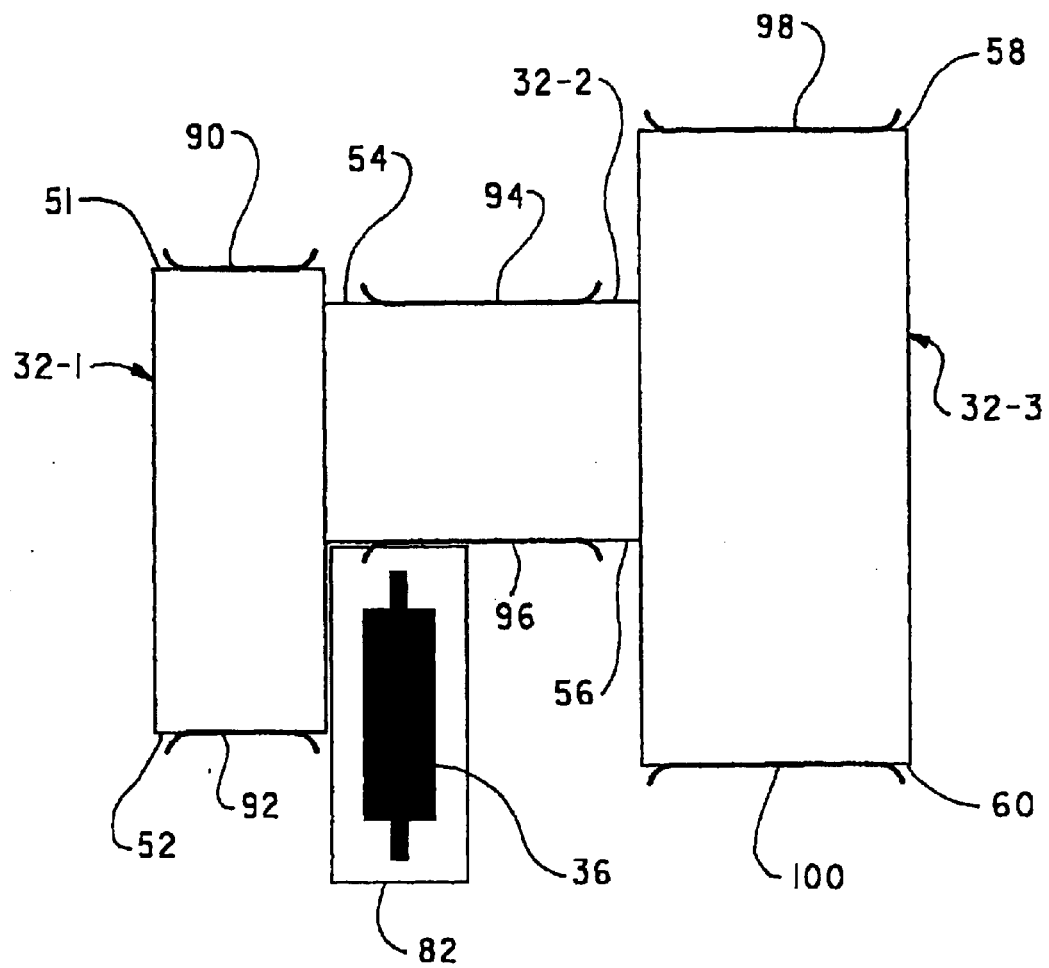
FIG. 6(c) shows the conformal outlines and the nonmember device of FIG. 6(b) after moving the second pair of sweep lines of each conformal outline apart.

FIG. 6(b) shows the result of sweeping nonmember device 36 with sweep line 72 selected in the above described manner concurrent with or after compaction of conformal outlines 32-1 to 32-3 and member devices 34-1 to 34-6 as shown in FIG. 5(b). To this end, FIG. 6(b) shows the completed compaction of FIG. 5(b) excluding member devices 34-1 to 34-6 and including nonmember device 36.

If necessary, to exclude nonmember device 36 from conformal outlines 32-1 to 32-3, another pair of spaced parallel sweep lines can be defined between the edges of each conformal outline 32-1 to 32-3. Specifically, sweep lines 90 and 92 can be defined between edges 51 and 52 of conformal outline 32-1; sweep lines 94 and 96 can be defined between edges 54 and 56 of conformal outline 32-2; and sweep lines 98 and 100 can be defined between edges 58 and 60 of conformal outline 32-3.

If the starting position of one sweep line violates spacing constraint 82, nonmember device 36 moves in the same direction as the one sweep line a distance sufficient to avoid the violation. If a pair of sweep lines violates spacing constraint 82, nonmember device 36 moves a distance sufficient in the direction of the movement of the sweep line having the most area of nonmember device 36 to the movement side thereof to avoid the violation of spacing constraint 82. For example, in FIG. 6(*b*), sweep lines 94 and 96 violate spacing constraint 82. Since nonmember device 36 has more area to the movement side of sweep line 96, nonmember device 36 moves in the movement direction of sweep line 96 until there is no further violation of spacing constraint 82. Where an equal area of nonmember device 36 resides on the movement sides of a pair of sweep lines, the decision to move nonmember device 36 in the direction of either sweep line can be made arbitrarily. Similar comments apply in respect of nonmember device 36 and sweep lines 40 to 50.

Once nonmember device 36 is positioned so that there is no violation of spacing constraint 82 by any of sweep lines 90 to 100, the distance between each pair of sweep lines 90 and 92; 94 and 96; and 98 and 100 is caused to increase. If increasing the distance between each pair of sweep lines 90 to 100 would result in a violation of spacing constraint 82, nonmember device 36 moves in the same direction as the sweep line causing the violation. For example, assume that nonmember device 36 is initially moved so that the rectangle representing spacing constraint 82 is at the position shown in phantom in FIG. 6(*b*). Starting from this position, in response to increasing the distance between sweep lines 94 and 96, nonmember device 36 moves in the same direction as sweep line 96. Increasing the distance between each pair of sweep lines 90 to 100 progresses until they overlap edges 51 to 60, respectively, whereupon the movement of sweep lines 90 to 100 is terminated.

The result of increasing the distance between sweep lines 94 and 96 and the corresponding movement of nonmember device 36 outside of conformal outlines 32-1 to 32-3 is shown in FIG. 6(*c*). As can be seen, when the results of compacting member devices 34-1 to 34-6 and conformal outlines 32-1 to 32-3 shown in FIG. 5(*b*) and the results of moving nonmember device 36 outside of compacted conformal outlines 32-1 to 32-3 shown in FIG. 6(*c*) are combined, they yield the compaction shown in FIG. 4(*b*).

If all or part of each of a plurality of nonmember devices 36 is defined in one or more of conformal outlines 32-1, 32-2 and 32-3 and if moving one nonmember device 36 in response to increasing the distance between each pair of sweep lines would result in a violation of the spacing constraint 82 thereof or of a spacing constraint 82 of another nonmember device 36, both nonmember devices 36 can move in the same direction as the sweep lines causing such violation if such movement, by itself, would not result in a violation of any spacing constraint that cannot be avoided by moving at least one other nonmember device.

In the foregoing description, spacing constraint 82 is associated with each nonmember device 36. However, if desired, a spacing constraint can be associated with each sweep line 70 to 80, and 90 to 100 instead of each nonmember device 36. Each of these spacing constraints can set a minimum distance the corresponding sweep line can be spaced from a nonmember device 36. The movement of nonmember device 36 in FIGS. 6(*a*) to 6(*c*) would occur in the same manner as described above in response to the spacing constraint associated with each sweep line. However, if a circuit included two or more nonmember devices 36, the absence of a spacing constraint associated with each nonmember device 36 may result in an overlap of the one or more nonmember devices 36 when moved outside of conformal outlines 32-1 to 32-3. This can easily be remedied by manual manipulation of the overlapping nonmember devices 36 by a user of the computer software program of the present invention via a suitable user interface.

The compaction method of the present invention will now be described in connection with compaction of a conformal outline wherein a plurality of member devices is defined in an uncompacted conformal outline with a violation of one or more spacing constraints. To this end, the distance between each pair of member devices having a violation of at least one spacing constraint thereof is increased and, if necessary, the distance between the sides and/or edges of the conformal outline is increased in order to accommodate the increased distance between the member devices.

Figure 7A:
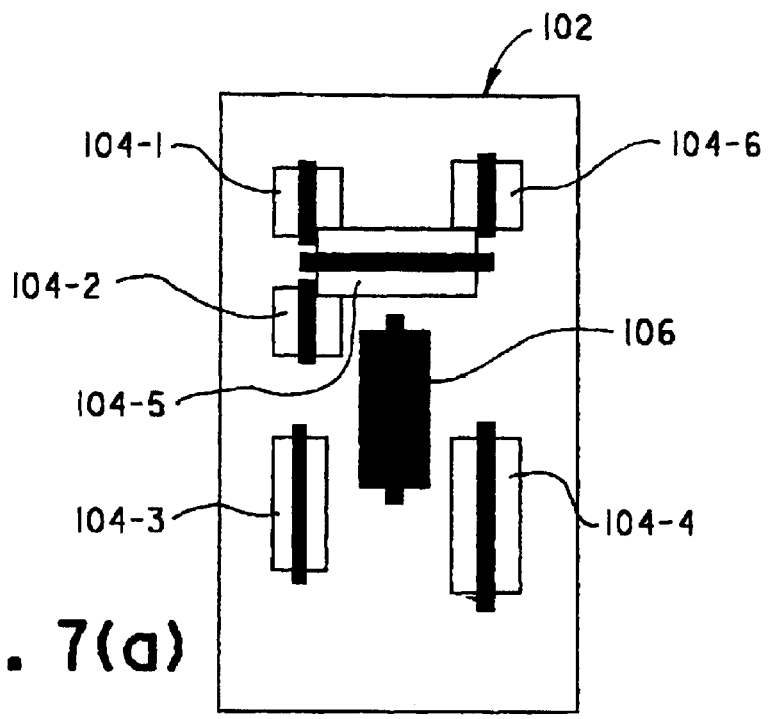
FIG. 7(a) shows a conformal outline of a circuit having member devices and a nonmember device defined therein.

With reference to FIG. 7(*a*), a plurality of member devices 104-1 to 104-6 and a nonmember device 106 are defined in a conformal outline 102. The results of compacting the circuit of FIG. 7(*a*) by increasing the distance between member devices 104 and the sides of conformal outline 102 and excluding nonmember device 106 from conformal outline is shown in FIG. 7(*b*).

The compaction method will now be described in connection with compacting conformal outline 102 and member devices 104-1 to 104-6. Thereafter, the compaction method will be described in connection with moving nonmember device 106 outside of compacted conformal outline 102. However, this order is not to be construed as limiting the invention.

With reference to FIGS. 8(*a*) and 8(*b*), where nonmember device 106 has been omitted for the purpose of illustration, conformal outline 102 is defined by a pair of spaced parallel sides 110 and 112 and a pair of spaced parallel edges 114 and 116 that establish a boundary of the circuit. Spacing constraints 108-1 to 108-6 are associated with member devices 104-1 to 104-6, respectively. Each spacing constraint 108 sets a minimum distance the corresponding member device 104 can be spaced from (i) another member device 104, (ii) each side 110 and 112 of conformal outline 102 and, if desired, (iii) each edge 114 and 116 of conformal outline 102.

At an appropriate time, the distance between each pair of member devices 104 having a violation of at least one spacing constraint 108 thereof is increased until the violation is overcome. For example, in FIG. 8(*a*), member devices 104-1, 104-2, 104-5 and 104-6 are positioned whereupon their respective spacing constraints 108-1, 108-2, 108-5 and 108-6 are violated. To overcome these violations, the distance between each pair of member devices 104-1 and 104-5; 104-2 and 104-5; and 104-5 and 104-6 is increased until these member devices are positioned as shown in FIG. 8(*b*). In the example shown in FIGS. 8(*a*) and 8(*b*), the distance between the member devices is increased horizontally. However, this is not to be construed as limiting the invention since the distance between pairs of member devices can also or alternatively be increased vertically if desired.

If increasing the distance between member devices 104 would cause a violation of a spacing constraint 108 by one of sides 110 and 112, the distance between sides 110 and 112 is increased to accommodate the increased spacing between member devices 104 without any violation of a spacing constraint 108 by side 110 or 112. To this end, the distance between sides 110 and 112 can be increased just to the point to accommodate member devices 104 in conformal outline 102 without a violation of a spacing constraint 108 of any member device 104. However, this is not to be construed as limiting the invention since the distance between sides 110 and 112 can be increased to provide additional spacing between each side 110 and 112 and any member device 104 of conformal outline 102. Similarly, the distance between each pair of member devices 104 having a violation of at least one spacing constraint thereof can be increased just to the point where the violation is overcome. However, this is not to be construed as limiting the invention since the distance between each pair of member devices can be increased beyond the minimum distance that avoids a violation of one of the spacing constraints thereof.

Figure 8A:
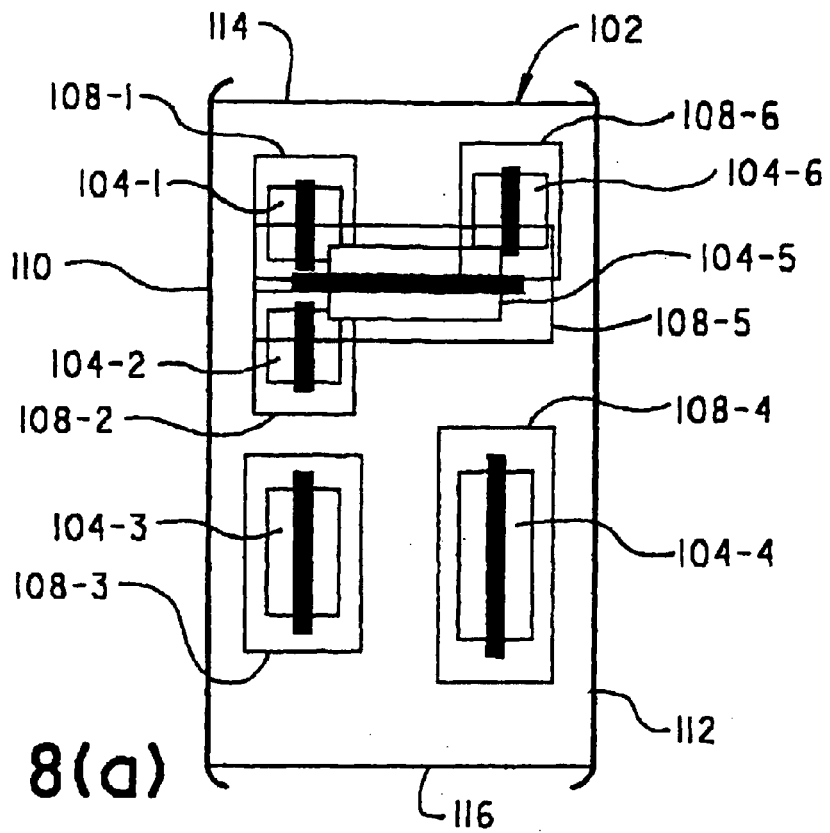
FIG. 8(a) shows the conformal outline and the member devices of FIG. 7(a) before compaction.
Figure 8B:
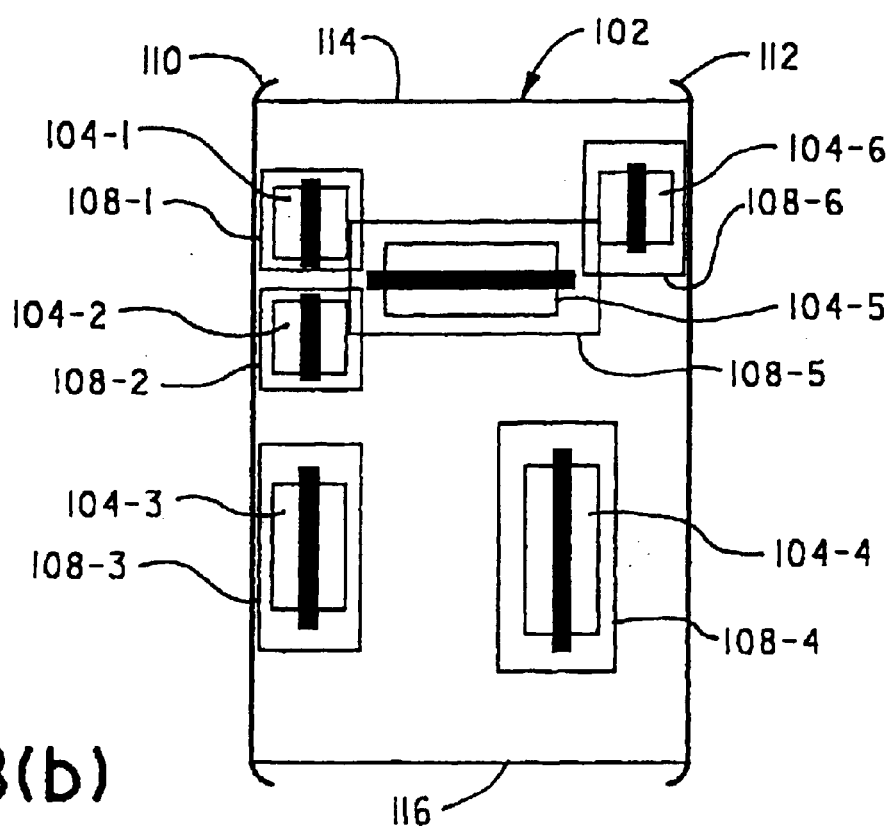
FIG. 8(b) shows the conformal outline and member devices of FIG. 8(a) after compaction.

In the example shown in FIGS. 8(a) and 8(b), it was only necessary to increase the distance between member device 104-5 and 104-6 and increase the distance between member device 104-5 and member devices 104-1 and 104-2 to overcome violations of spacing constraints 108-1; 108-2; 108-5; and 108-6. However, it is generally desirable to maintain the relative location of member devices 104 in the compacted conformal outline 102 shown in FIG. 8(b). To this end, the position of member device 104-3 can be linked to the movement of side 110 or the position of member device 104-2, and the movement of member device 104-4 can be linked to the position of member device 104-5. However, this is not to be construed as limiting the invention since the movement of member devices 104-3 and 104-4 to the final positions shown in the uncompacted conformal outline 102 shown in FIG. 8(b) can occur in any desirable manner. Moreover, the final positions of member devices 104-3 and 104-4 in uncompacted conformal outline 102 shown in FIG. 8(b) is not to be construed as limiting the invention since variations in the final positions of member devices 104-3 and 104-4 are envisioned.

If desired, the compaction method can also be applied, as necessary, to increasing the vertical distance between member devices 104-1 to 104-6 and/or edges 114 and 116. Since it will be apparent to one of ordinary skill in the art that the foregoing method of increasing the horizontal distance between member devices 104-1 to 104-6 and/or sides 110 and 112 is equally applicable to increasing the vertical distance between member devices 104-1 to 104-6 and/or edges 114 and 116, a detailed description of the foregoing method in connection with increasing the vertical distance between member devices 104-1 to 104-6 and/or edges 114 and 116 has not been included herein to avoid needless repetition.

Moreover, it will be apparent to one of ordinary skill in the art that increasing the horizontal distance between a first layout of member devices 104-1 to 104-6 and/or sides 110 and 112 can be combined with decreasing the horizontal distance between a second layout of member devices 104-1 to 104-6 and/or sides 110 and 112 in the manner described above in connection with FIGS. 2(a) and 2(b). Stated generally, any combination of increasing and/or decreasing the distance between member devices and/or the sides and/or edges of a conformal outline is envisioned.

The movement of nonmember device 106 outside of conformal outline 102 will now be described with reference to FIGS. 9(a) and 9(b) where member devices 104 have been omitted for the purpose of illustration.

Figure 9A:
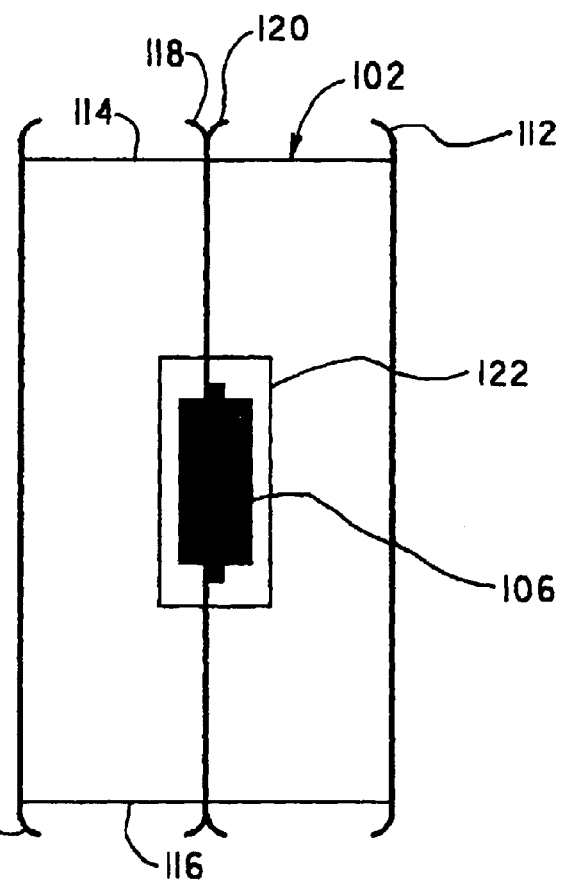
FIG. 9(a) shows the conformal outline and the nonmember device of FIG. 7(a) before compaction, including sweep lines defined between the sides of the conformal outline.

As shown in FIG. 9(a) a pair of spaced parallel sweep lines 118 and 120 is defined between sides 110 and 112 of conformal outline 102 and a spacing constraint 122 is associated with each nonmember device 106. Each spacing constraint 122 sets a minimum distance that the corresponding nonmember device 106 can be spaced from each sweep line 118 and 120 and another nonmember device 106. At an appropriate time, the horizontal distance between sweep lines 118 and 120 is caused to increase.

The spacing constraint 108 of each member device 104 is only affected by sides 110 and 112; edges 114 and 116 and other member devices 104. Similarly, spacing constraint 122 of each nonmember device 106 is only affected by sweep lines 118 and 120. Thus, one or more sweep lines 118 and 120 overlaying a spacing constraint 108 has no effect on the movement of the corresponding member device 104. Similarly, one or both sides 110 and 112 overlaying spacing constraint 122 has no effect on the movement of nonmember device 106.

If increasing the distance between sweep lines 118 and 120 would result in a violation of a spacing constraint 122 by one of sweep lines 118 and 120, each nonmember device 106 associated with the violated spacing constraint 122 moves in the same direction as the sweep line 118 or 120 causing the violation providing such movement, by itself, would not result in the violation of a spacing constraint.

For example, in FIG. 9(a), sweep lines 118 and 120 overlap nonmember device 106. However, because more of nonmember device 106 is positioned to the movement side of sweep line 120, nonmember device 106 moves in the same direction as sweep line 120.

Initially, nonmember device 106 moves toward side 112 a distance sufficient to avoid the starting position of sweep line 120 from violating spacing constraint 122. Thereafter, nonmember device 106 moves in the same direction as sweep line 120. Since spacing constraint 122 is unaffected by side 112, moving sweep line 120 toward side 112 continues until nonmember device 106 moves outside of conformal outline 102.

If moving one nonmember device 106 in response to movement of sweep line 118 or 120 would result in the violation of the spacing constraint thereof or another nonmember device in the movement path of the one nonmember device, both nonmember devices move in the same direction as the sweep line.

Figure 9B:
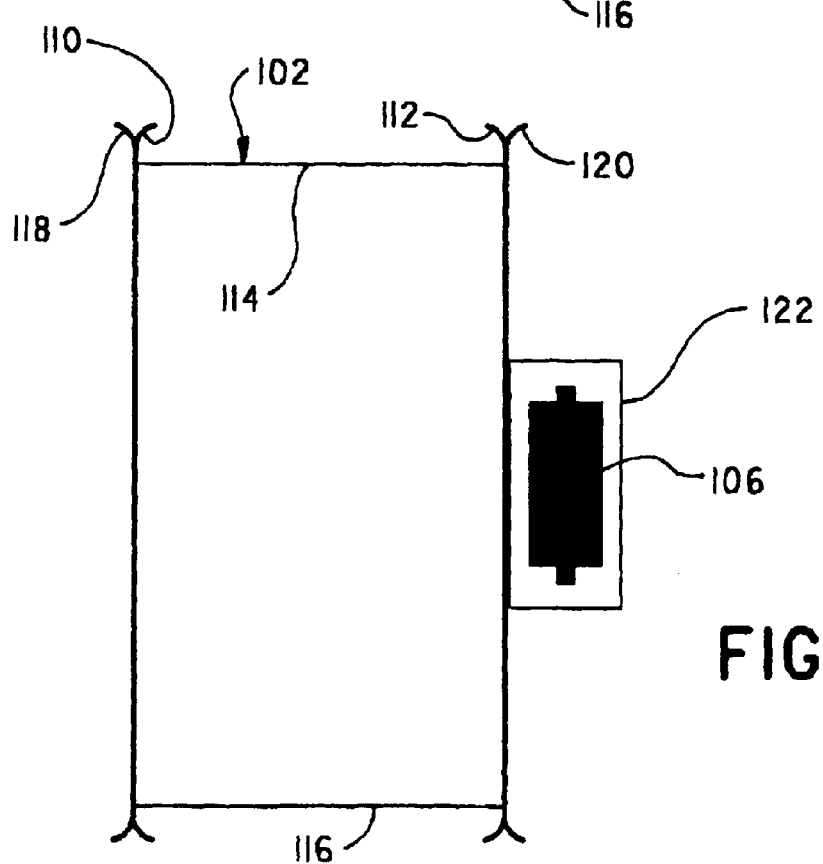
FIG. 9(b) shows the conformal outline and the nonmember device of FIG. 9(a) after compaction, with the nonmember device defined outside the compacted conformal outline.

Increasing the distance between sweep lines 118 and 120 causes nonmember device 106 to move outside of compacted conformal outline 102 as shown in FIG. 9(b). Increasing the distance between sweep lines 118 and 120 is terminated when they overlap or are coincident with sides 110 and 112, respectively.

Figure 7B:
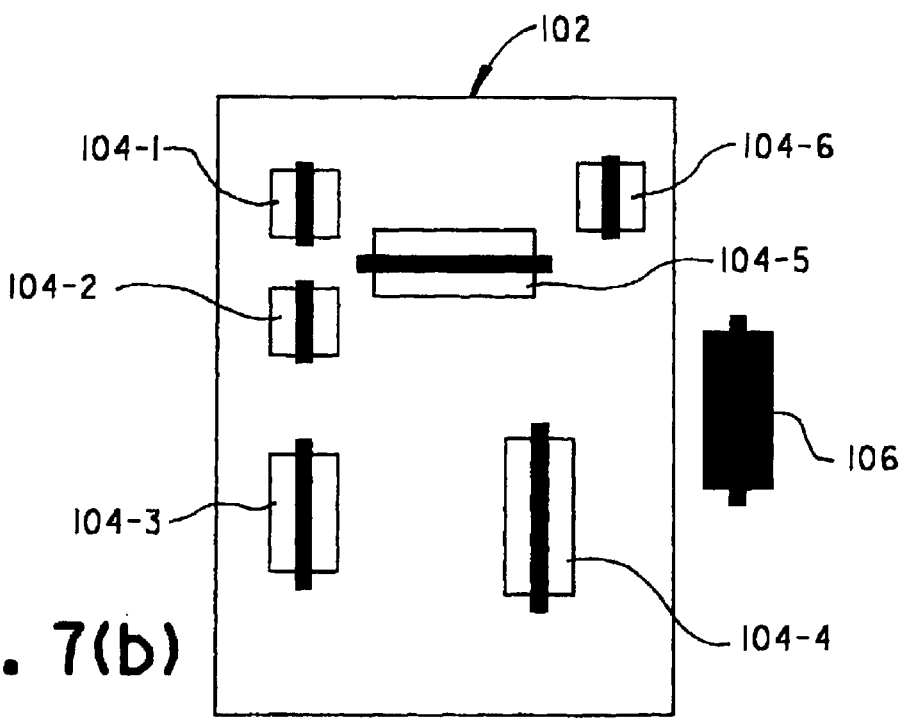
FIG. 7(b) shows the conformal outline and the member devices of FIG. 7(a) after compaction, with the nonmember device defined outside the conformal outline.

As can be seen, when the results of compacting member devices 104 and conformal outline 102 shown in FIG. 8(b) and the results of moving nonmember device 106 outside of the compacted conformal outline 102 shown in FIG. 9(b) are combined, they yielded the compaction shown in FIG. 7(b).

Figure 10A:
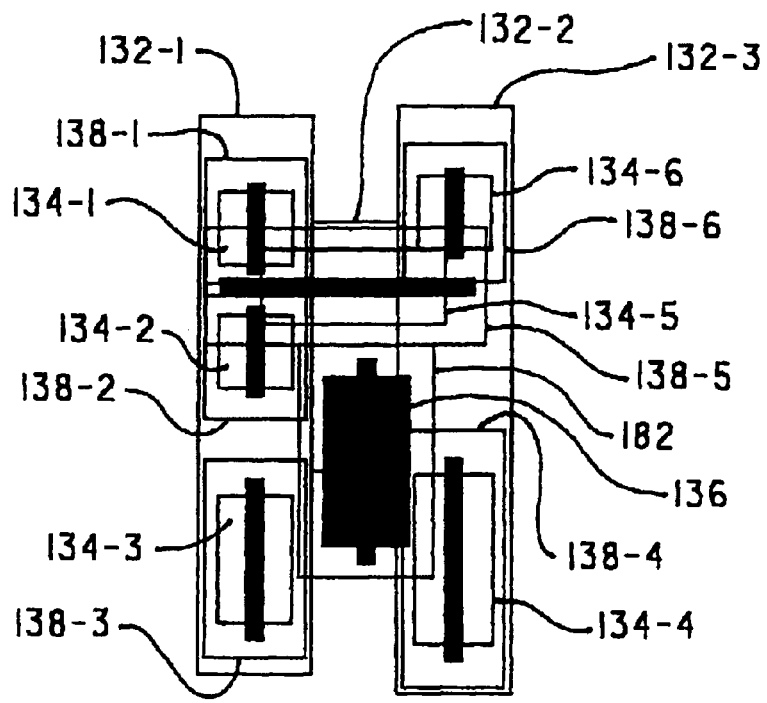
FIG. 10(a) shows a plurality of adjacent conformal outlines of a circuit with member devices defined therein with a violation of one or more spacing constraints and with a nonmember device partially received in two of the conformal outlines.
Figure 10B:
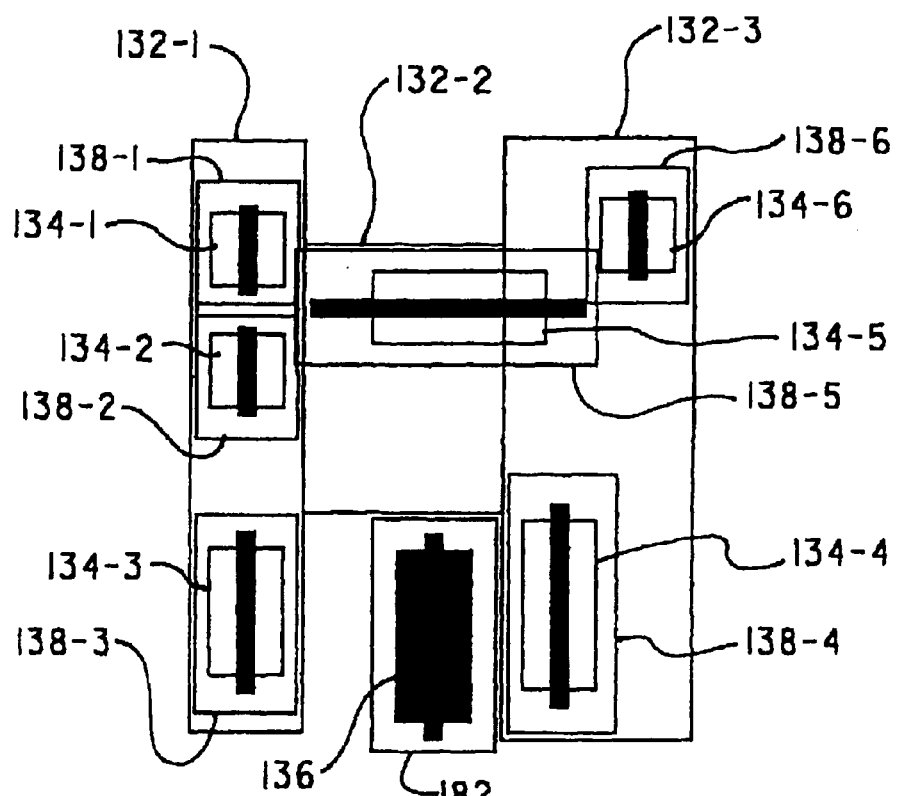
FIG. 10(b) shows the conformal outline and member devices of FIG. 10(a) after compaction, with the nonmember device defined outside the conformal outlines.

With reference to FIGS. 10(a) and 10(b), it will be apparent to one of ordinary skill in the art that the foregoing method of increasing the horizontal distance between member devices 104 and, if necessary, increasing the horizontal distance between sides 110 and 112 and moving nonmember device 106 outside of the compacted conformal outline 102 is applicable to member devices 134-1 to 134-6 positioned in at least one of a plurality of adjacent conformal outlines 132-1 to 132-3. To this end, each member device 134-1 to 134-6 has associated therewith a spacing constraint 138-1 to 138-6, respectively, that sets a minimum distance it can be spaced from (i) another member device, (ii) a portion of any side that does not overlap another side and, if desired, (iii) any edge of any of the conformal outlines. The compaction of member devices 134 and, as necessary, the sides of each conformal outline 132 occurs in the same manner discussed above in connection with the compaction of member devices 104 and sides 110 and 112 of conformal outline 102 shown in FIGS. 8(a) and 8(b).

For example, if conformal outlines 132 include at least one pair of member devices 134 having at least one violation of a spacing constraint 138 thereof, the compaction method increases the distance between the pair of member devices 134 to overcome the violation. If increasing the distance between the pair of member devices 134 would result in a violation of a spacing constraint 138 by one or more sides of the adjacent conformal outlines 134, the spacing between the sides of one or more conformal outlines 132 can be increased to accommodate the member devices 134 within the conformal outline while avoiding the violation of the spacing constraint 138. Desirably, the spacing between the pair of member devices 134 increases just to the point to avoid the violation of the spacing constraint 138. Similarly, if movement of the sides of at least one of the conformal outlines 132 is necessary to avoid a violation of a spacing constraint, the distance between the sides is increased just to the point where the violation is avoided without additional space between the side and any member device. However, this is not to be construed as limiting the invention.

Moreover, if, after increasing the spacing between member devices 134 to avoid a violation of the spacing constraint 138 thereof, the distance between the sides of one or more of the plurality of conformal outlines 132 can be decreased, as necessary, without violating a spacing constraint, the distance between the sides of the one or more of the plurality of conformal outlines is decreased to the point where no further decrease in the distance can occur without violating a spacing constraint.

The foregoing methods of compaction by increasing/decreasing the distance between member devices and/or sides and/or edges of one or more conformal outlines, along with moving nonmember devices outside the one or more conformal outlines was generally described in connection with an iterative process. However, as discussed above, the compaction method can also be realized by simultaneously solving a system of equations that express the various distances between member devices, nonmember devices, lines and/or edges. To this end, a system of simultaneous equations can be established and solved in order to determine the final positions of member devices inside of one or more conformal outlines, the final position of each nonmember device outside of one or more conformal outlines and/or the final positions of the sides and/or edges of one or more conformal outlines.

For example, for a single conformal outline having plural member devices and at least one nonmember device associated therewith, variables can be associated with the final locations of: each member device X, each nonmember device Y, the left side of the conformal outline $O_l$, the right side of the conformal outline $O_r$, the leftward moving sweep line $S_l$ and the rightward moving sweep line $S_r$.

Next, utilizing the foregoing variables, a system of equations representing the spacing constraints is established. This system of equations can have the following general form:

$X_i - X_j \geq d1$ (spacing constraint for member devices);

$O_r - X_i \geq d2$ (spacing constraint for member devices to the left of the right side);

$X_i - O_l \geq d3$ (spacing constraint for member devices to the right of the left side);

$Y_i - Y_j \geq d4$ (spacing constraint for nonmember devices);

$S_l - Y_i \geq d5$ (spacing constraint between leftward moving sweep line and nonmember devices);

and $Y_i - S_r \geq d6$ (spacing constraint between rightward moving sweep line and nonmember devices).

where i=device i, and j=device j.

Next, an objective function, i.e., minimize $(O_r - O_l)$, is established to minimize the distance between the sides of the conformal outline. In addition, constraints, i.e., $S_{l-Ol}=0$ and $S_r - O_r = 0$, are established to enforce overlap of the final location of the sweep lines with appropriate sides.

Once the foregoing system of equations, objective function and constraints are established, the system of equations is solved simultaneously to yield values for the variables, e.g., X, Y, O and S that represent the final locations of member devices and nonmember devices that satisfy the constraints and minimize the objective function.

The foregoing method of establishing and solving a system of simultaneous equations for a single conformal outline having one or more member devices associated therewith is also applicable to a plurality of adjacent conformal outlines having one or more member devices positioned in at least one of the conformal outlines. However, with the plurality of conformal outlines, extra constraints are required for keeping the final locations of adjacent pair of sides overlapping. A general form of these extra constraints for three adjacent conformal outlines is the following:

$O1_r - O2_l = 0$; and $O2_r - O3_l = 0$

To enable movement of member devices across overlapping sides of adjacent conformal outlines, no equation is established where the sides of adjacent conformal outlines overlap. However, to avoid movement of member devices across the portion of each side of an adjacent conformal outline that does not overlap another side, a suitable equation is established for each such side portion. These equations then become part of the system of equations that are solved simultaneously to yield values for the variables, e.g., X, Y, O and S, that represent the final locations of member devices, nonmember devices, sides and/or edges that satisfy the constraints and minimize the objective function.

In order for the movement of a nonmember device to be linked to the movement of one of a pair of converging sweep lines from adjacent conformal outlines, a slack variable $L_n$ is inserted as an extra term in each spacing constraint, e.g., $S_l - Y_i + L_n \geq d5$. Moreover, the slack variable $L_n$ and a weighting $W_n$ are inserted as extra terms in the objective function, e.g., $W_n * L_n + O_r - O_l$. The thus modified spacing constraints can be solved simultaneously to yield values for the variables that represent the final locations of member devices, nonmember devices, sides and/or edges that satisfy the constraints and minimize the modified objective function.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A circuit design layout compaction method comprising:
   (a) defining a conformal outline having a pair of spaced parallel sides;
   (b) defining in the conformal outline a first member device and a second member device;
   (c) associating with each member device a spacing constraint that sets a minimum distance the member device can be spaced from the other member device and each side of the conformal outline;
   (d) decreasing a spacing between the first and second member devices such that no further decrease in spacing therebetween can occur without violating a spacing constraint; and
   (e) decreasing the spacing between the sides of the conformal outline such that no further decrease in spacing between the sides can occur without at least one of the sides violating a spacing constraint.

2. The method of claim 1, further including:
   (f) defining at least a portion of at least one nonmember device in the conformal outline;
   (g) defining a pair of spaced parallel sweep lines between the sides of the conformal outline;
   (h) associating a spacing constraint with one of (1) each nonmember device and (2) each sweep line, the spacing constraint associated with each nonmember device setting a minimum distance the nonmember device can be spaced from each sweep line and another nonmember device, the spacing constraint associated with each sweep line setting a minimum distance the sweep line can be spaced from each nonmember device;
   (i) increasing the spacing between the sweep lines whereupon each sweep line overlaps one of the sides of the conformal outline; and
   (j) responsive to the increased spacing in step (i), positioning each nonmember device outside the conformal outline whereupon the spacing constraint of the one of each nonmember device and each sweep line is not violated.

3. The method of claim 2, wherein, in step (g), if one of the sweep lines overlaps the one nonmember device, step (j) includes positioning the one nonmember device outside the conformal outline on the side thereof that is overlapped by said one sweep line in step (i).

4. The method of claim 2, wherein, in step (g), if the pair of sweep lines overlap the one nonmember device, step (j) includes determining which sweep line has the most area of the one nonmember device between it and the side of the conformal outline that said sweep line overlaps in step (i) and positioning the one nonmember device outside the conformal outline adjacent said side.

5. The method of claim 2, wherein:
   the spacing constraint of each member device is not violated by any sweep line; and
   the spacing constraint of each nonmember device is not violated by any side of the conformal outline.

6. The method of claim 2, wherein, in step (d) and step (i) the respective decrease and increase in spacing occurs incrementally.

7. A circuit design layout compaction method comprising:
   (a) defining a plurality of adjacent conformal outlines and a plurality of member devices positioned in at least one of the conformal outlines, with each conformal outline having a pair of spaced parallel sides, with each pair of adjacent conformal outlines having sides that overlap;
   (b) associating with each member device a spacing constraint that sets a minimum distance the member device can be spaced from another member device and a portion of any side that does not overlap another side;
   (c) decreasing a spacing between at least one pair of member devices such that no further decrease in spacing between the one pair of member devices can occur without violating a spacing constraint; and
   (d) subject to the sides of each pair of adjacent conformal outlines remaining overlapping, decreasing the spacing between the sides of each conformal outline such that no further decrease in spacing between the sides of each conformal outline can occur without at least one of the sides violating a spacing constraint.

8. The method of claim 7, further including:
   (e) defining a pair of spaced parallel sweep lines between the sides of each conformal outline;
   (f) defining at least one nonmember device that is at least partially received in at least one conformal outline;
   (g) associating a spacing constraint with one of (1) each nonmember device and (2) each sweep line, the spacing constraint associated with each nonmember device setting a minimum distance the nonmember device can be spaced from each sweep line and another nonmember device, the spacing constraint associated with each sweep line setting a minimum distance the sweep line can be spaced from each nonmember device; and
   (h) increasing the spacing between each pair of sweep lines whereupon each sweep line overlaps one of the sides of the conformal outline where it was defined in step (e).

9. The method of claim 8, wherein, if, in step (f), at least part of the one nonmember device is positioned between the starting position of one of the sweep lines in step (e) and the final position of said one sweep line in step (h), the method includes positioning the one nonmember device outside the conformal outline where said one sweep line was defined in step (e) and adjacent the final position of said one sweep line in step (h) with no violation of the spacing constraint of the one of (1) the one nonmember device and (2) said one sweep line.

10. The method of claim 8, wherein, if at least part of the one nonmember device is positioned between two sweep lines in adjacent conformal outlines, the method includes selecting one of the two sweep lines and positioning the one nonmember device outside the conformal outline where the selected sweep line was defined in step (e) and adjacent the final position of the selected sweep line in step (h) with no violation of the spacing constraint of the one of (1) the one nonmember device and (2) the selected sweep line.

11. The method of claim 10, wherein, selecting one of the two sweep lines to be said one sweep line includes:
   comparing an amount of overlap of a projection of the nonmember device on each of the two sweep lines; and
   selecting as the one sweep line the one having the largest overlap.

12. The method of claim 9, wherein, if one pair of spaced parallel sweep lines in step (e) overlaps the one nonmember device, the method includes selecting one of the sweep lines of the one pair of sweep lines as said one sweep line based on one of (1) the largest area of the one nonmember device being disposed between the starting and final positions of said one sweep line of said one pair of sweep lines and (2) arbitrarily when an equal area of the one nonmember device is disposed between the starting and final positions of each sweep line of said one pair of sweep lines.

13. The method of claim 8, wherein:

the spacing constraint of each member device is not violated by any sweep line; and the spacing constraint of each nonmember device is not violated by any side of any conformal outline.

* * * * *